(12) United States Patent
Toyonaga et al.

(10) Patent No.: US 10,070,530 B2
(45) Date of Patent: Sep. 4, 2018

(54) ELECTRONIC COMPONENT AND MANUFACTURING METHOD THEREOF

(71) Applicant: ROHM CO., LTD., Kyoto (JP)

(72) Inventors: Motohiro Toyonaga, Kyoto (JP); Yasuhiro Fuwa, Kyoto (JP); Mamoru Yamagami, Kyoto (JP); Isamu Nishimura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/646,086

(22) Filed: Jul. 10, 2017

(65) Prior Publication Data

US 2018/0020549 A1    Jan. 18, 2018

(30) Foreign Application Priority Data

Jul. 14, 2016    (JP) .................. 2016-139701

(51) Int. Cl.

| | |
|---|---|
| H05K 1/18 | (2006.01) |
| H01L 21/48 | (2006.01) |
| H01L 23/00 | (2006.01) |
| H01L 23/13 | (2006.01) |
| H01L 23/498 | (2006.01) |
| H01L 23/31 | (2006.01) |
| H05K 1/11 | (2006.01) |
| H05K 3/00 | (2006.01) |
| H05K 3/28 | (2006.01) |
| H05K 1/02 | (2006.01) |

(52) U.S. Cl.
CPC ........... *H05K 1/186* (2013.01); *H01L 21/481* (2013.01); *H01L 21/4853* (2013.01); *H01L 23/13* (2013.01); *H01L 23/3121* (2013.01); *H01L 23/49811* (2013.01); *H01L 23/562* (2013.01); *H01L 24/16* (2013.01); *H01L 24/97* (2013.01); *H05K 1/0271* (2013.01); *H05K 1/111* (2013.01); *H05K 3/0052* (2013.01); *H05K 3/284* (2013.01); *H01L 2224/16225* (2013.01); *H01L 2924/15153* (2013.01); *H05K 2201/09018* (2013.01); *H05K 2201/10636* (2013.01); *H05K 2203/1316* (2013.01)

(58) Field of Classification Search
USPC .......................................... 361/761, 760, 763
See application file for complete search history.

(56) References Cited

U.S. PATENT DOCUMENTS 8,227,702 B2 *    7/2012   Ikeda .................. H05K 3/4061
                                                               174/256
8,371,026 B2 *    2/2013   Nomiya ............. H01L 21/4857
                                                               174/255

FOREIGN PATENT DOCUMENTS

JP          2013-197263 A        9/2013

* cited by examiner

*Primary Examiner* — Andargie M Aychillhum
(74) *Attorney, Agent, or Firm* — Rabin & Berdo, P.C.

(57) ABSTRACT

An electronic component includes a substrate including a first principal surface, a second principal surface positioned on a side opposite to the first principal surface, a first side surface that connects the first principal surface and the second principal surface and that extends along a first direction, a second side surface that connects the first principal surface and the second principal surface and that extends along a second direction intersecting the first direction, and a corner portion that connects the first side surface and the second side surface and that has a curved surface curved outwardly, and a chip arranged at the first principal surface of the substrate.

16 Claims, 16 Drawing Sheets

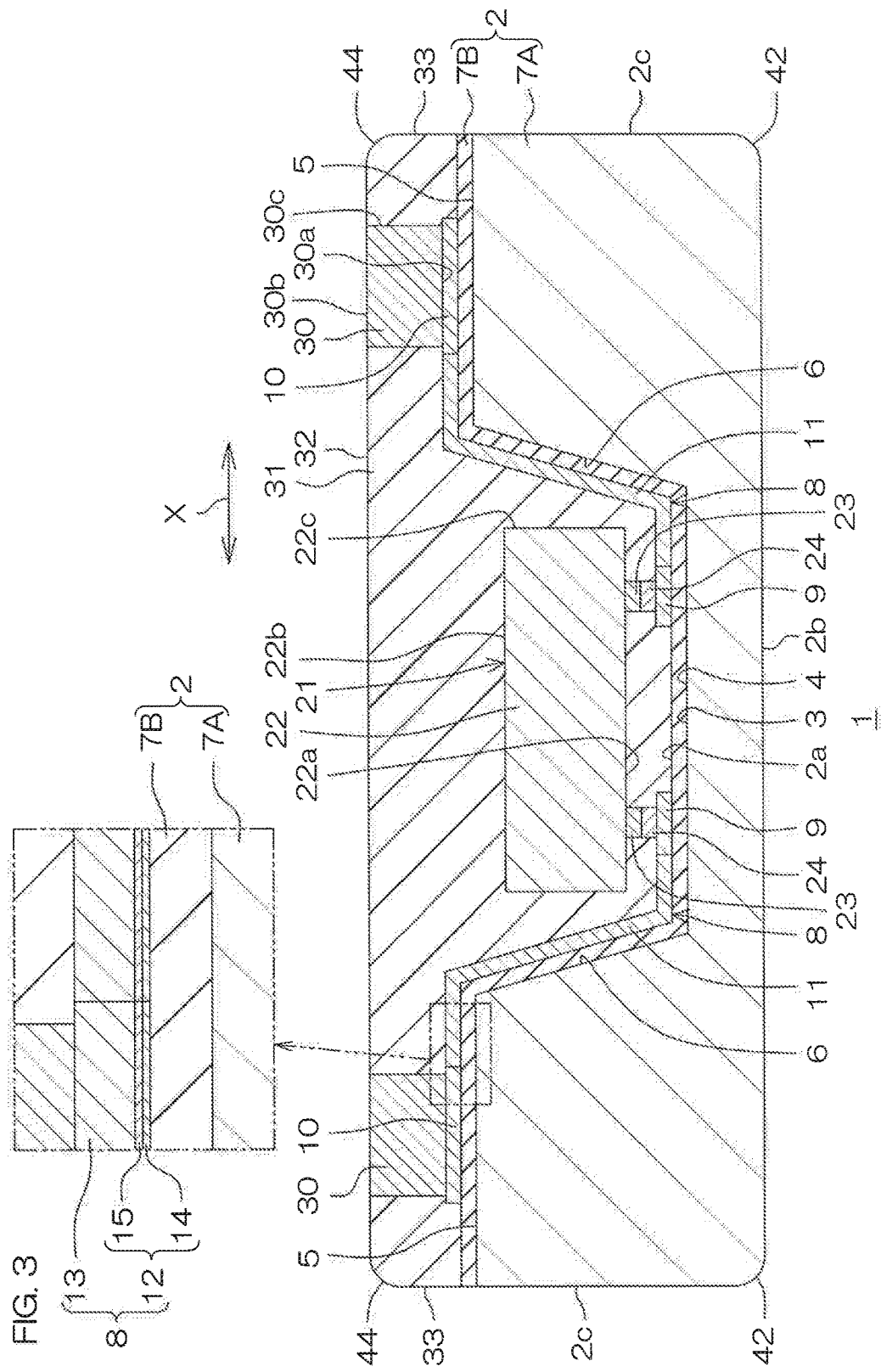

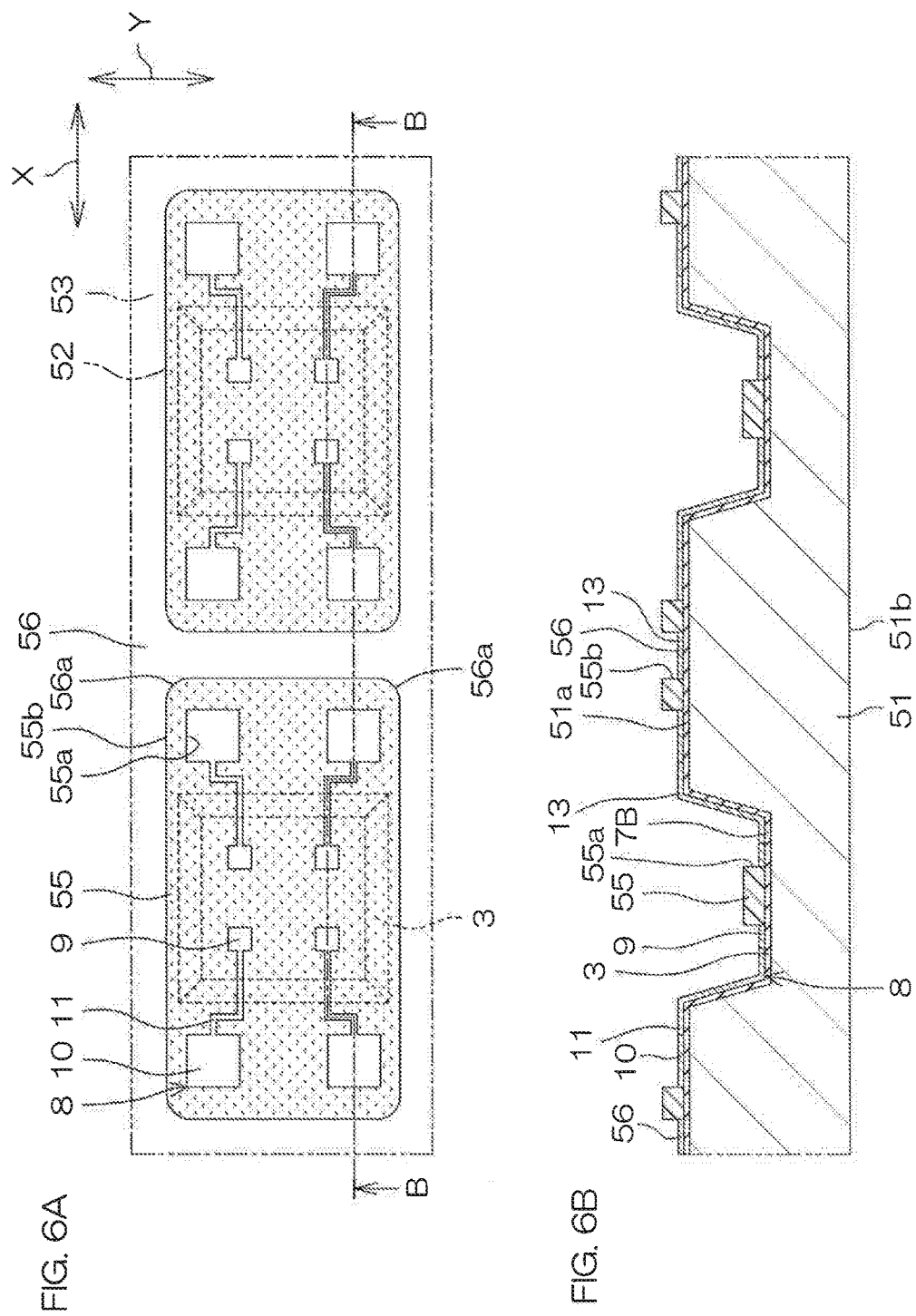

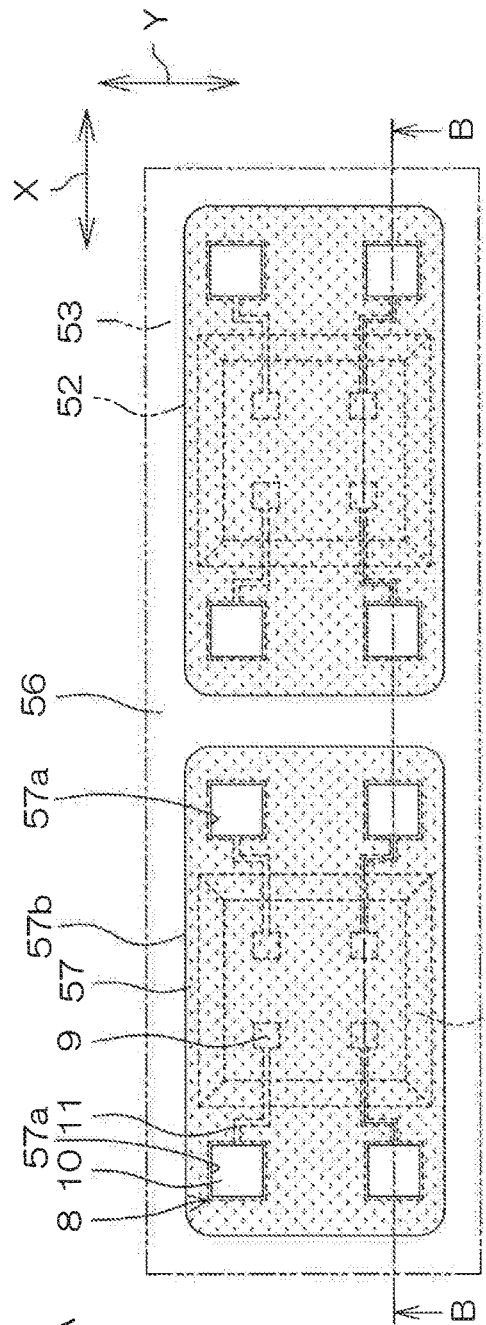
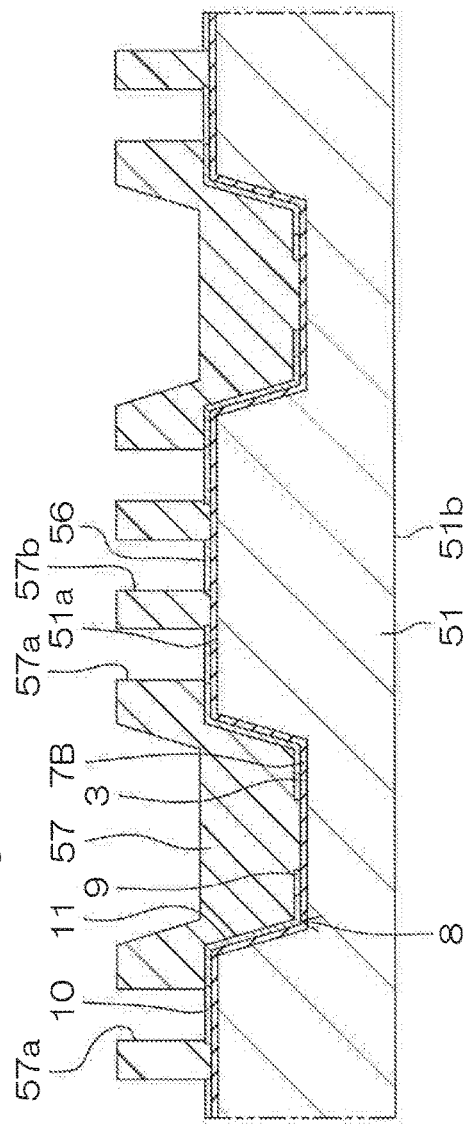

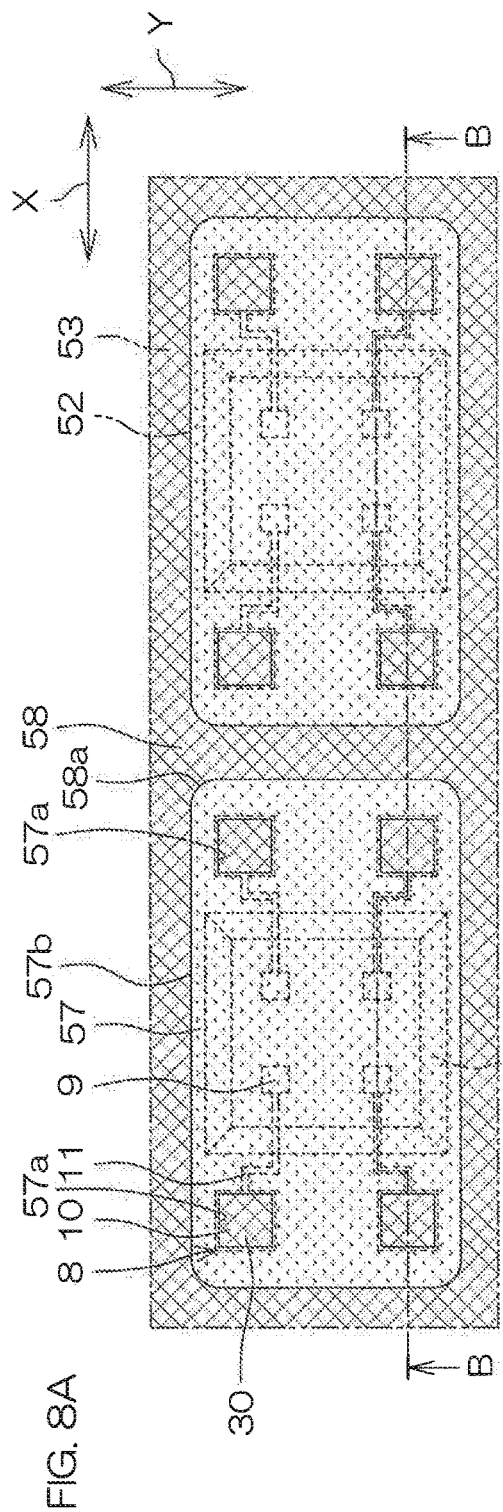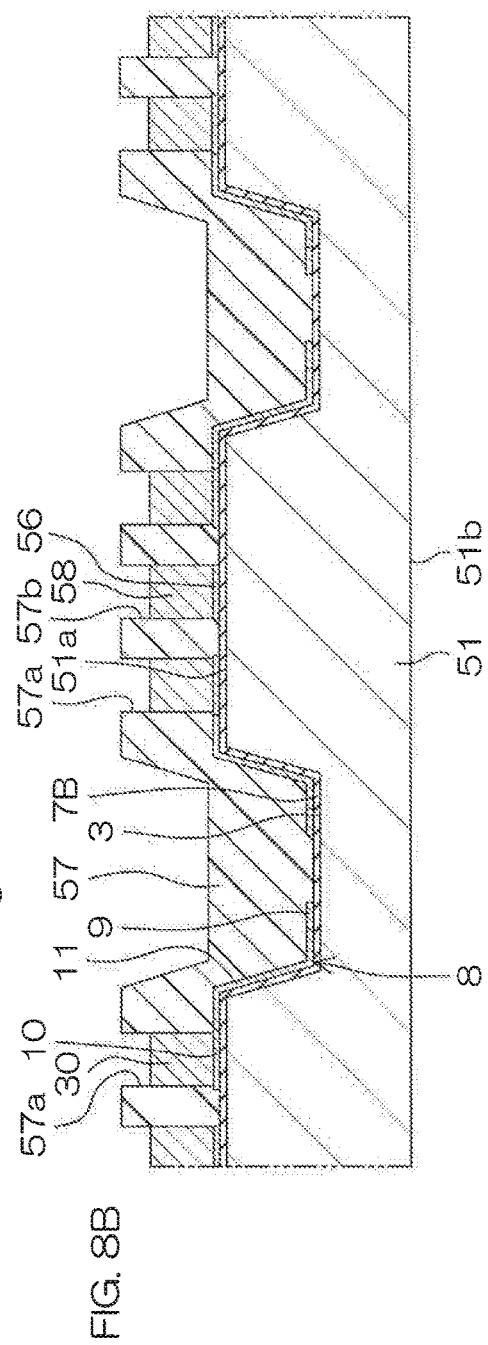

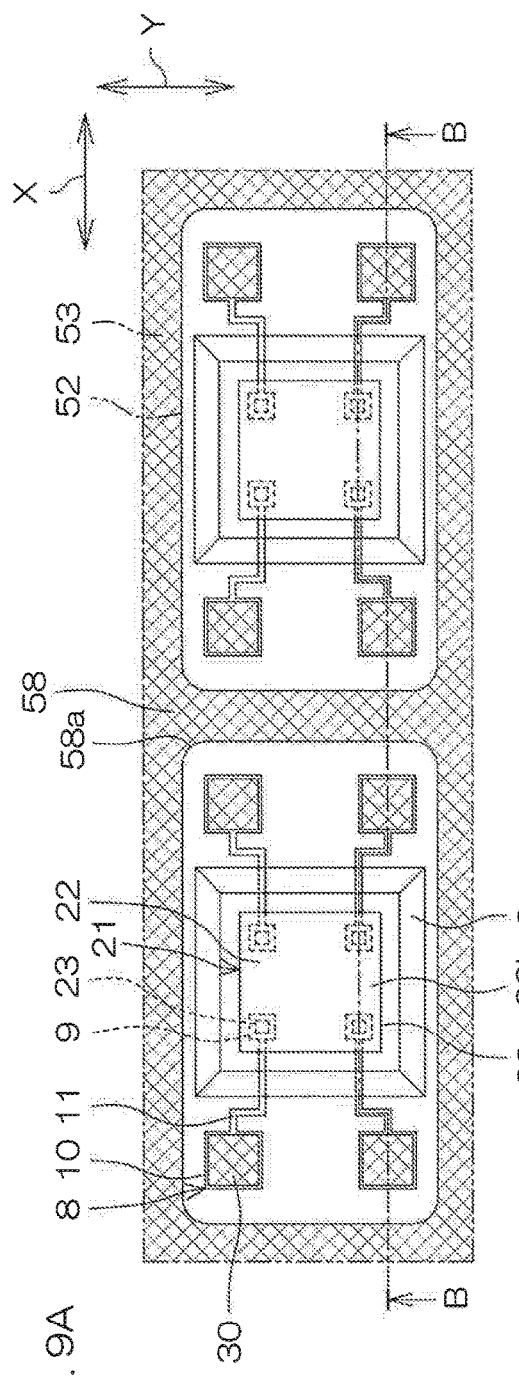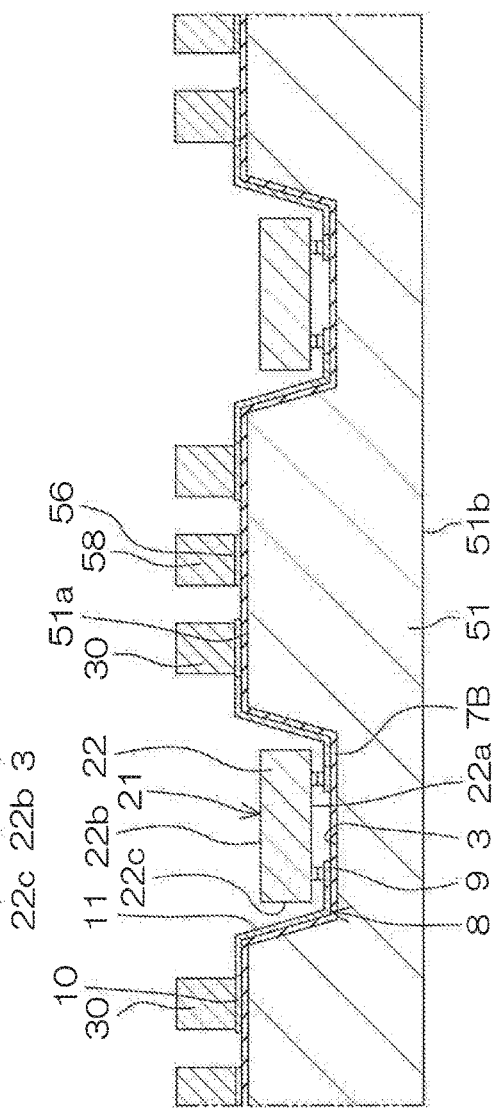

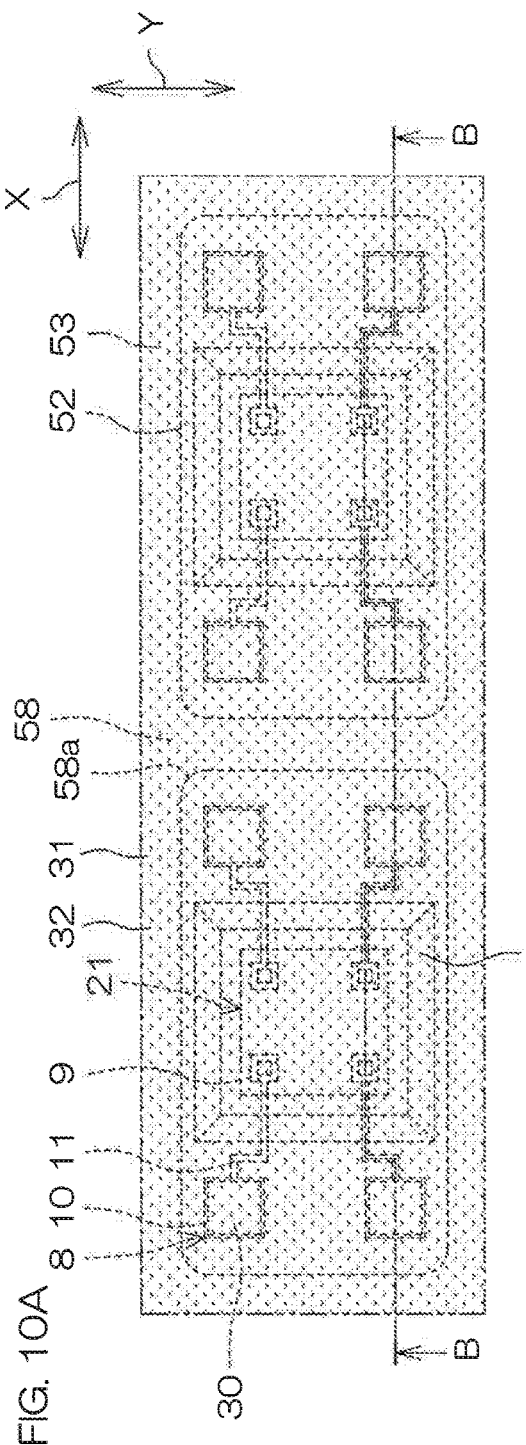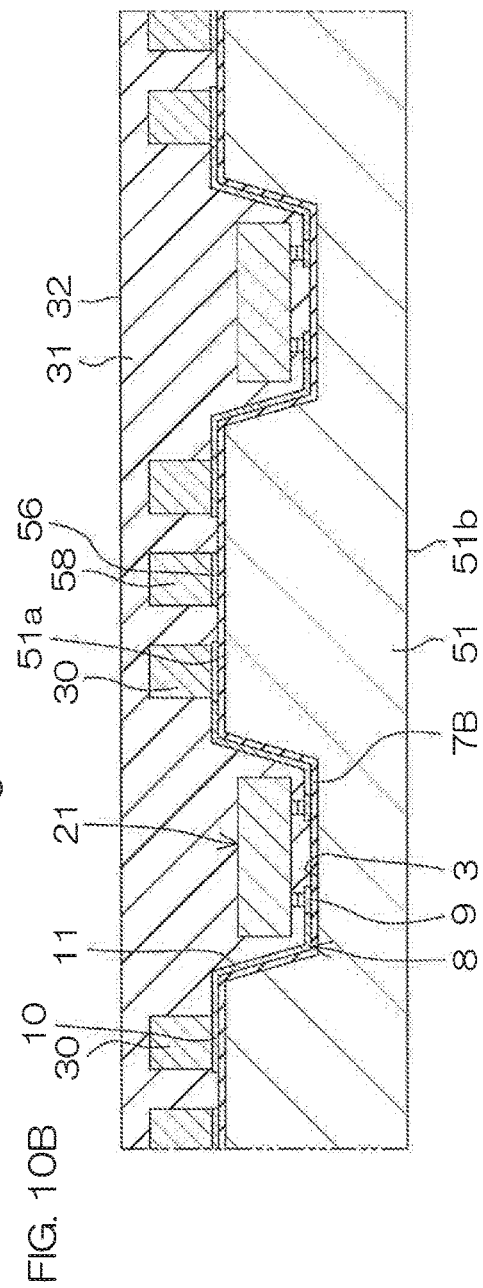

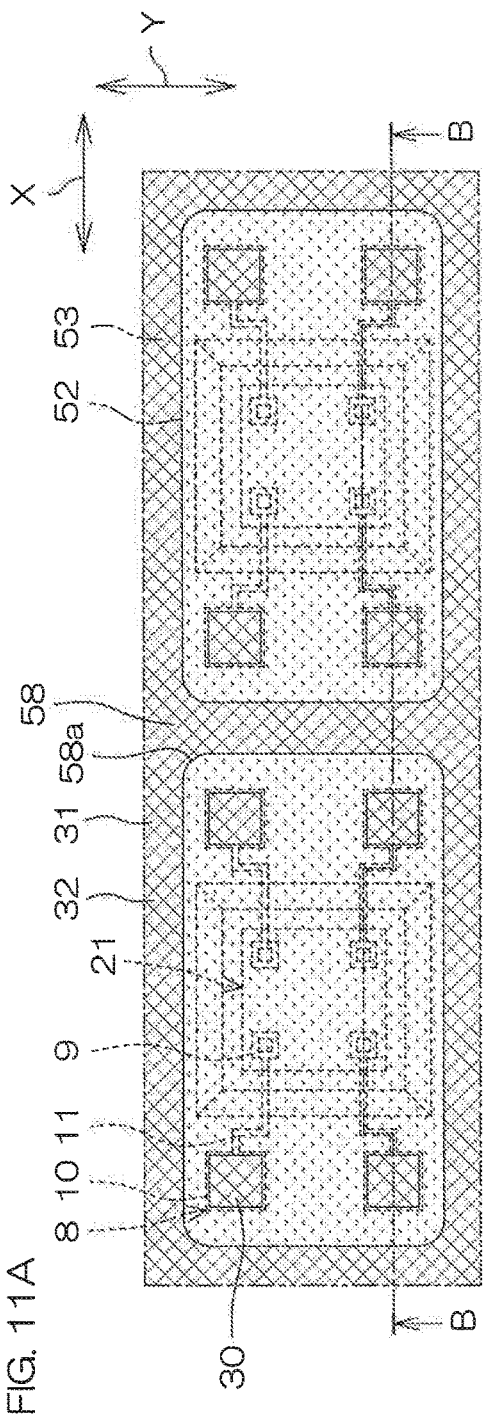

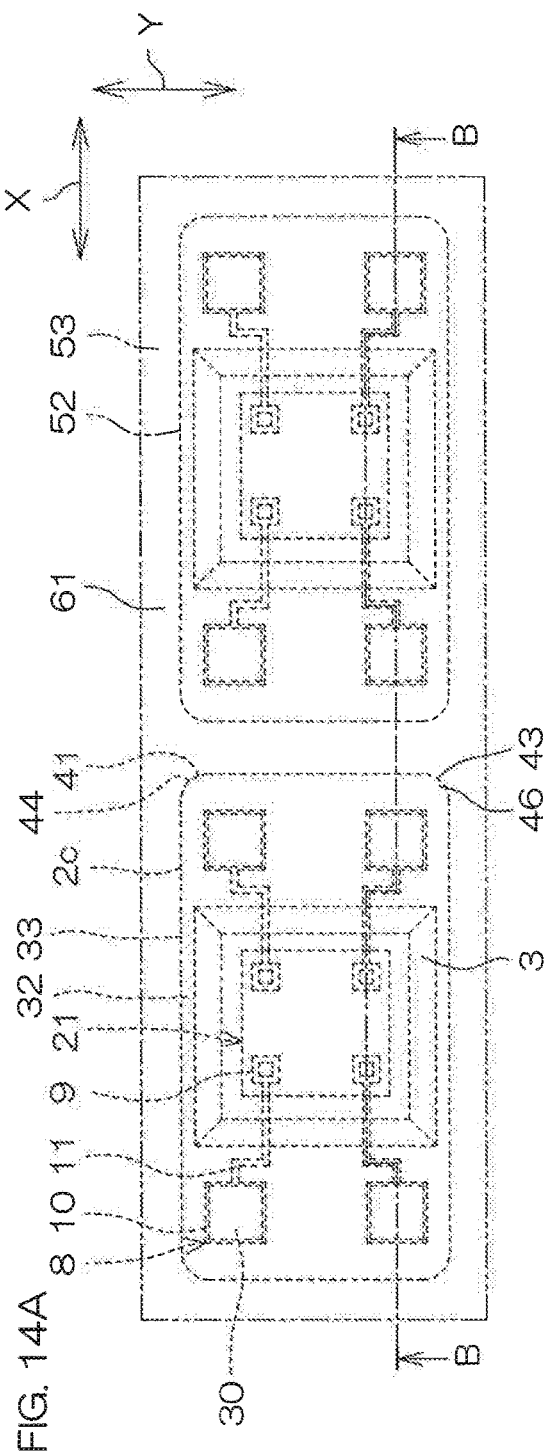
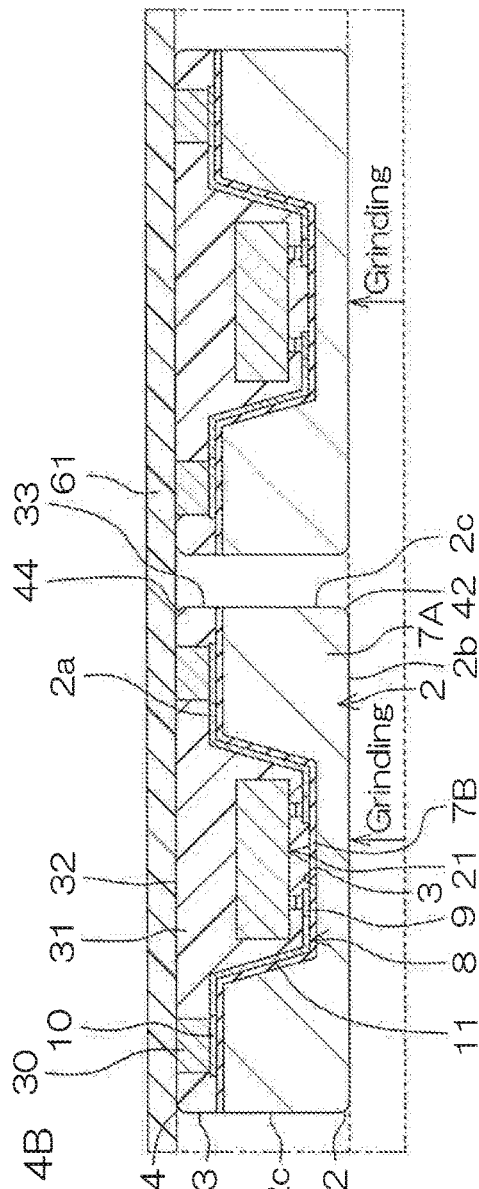
FIG. 14A
FIG. 14B

ELECTRONIC COMPONENT AND MANUFACTURING METHOD THEREOF

BACKGROUND OF THE INVENTION

1. Field of the Invention

The present invention relates to an electronic component and a method for manufacturing the electronic component.

2. Description of the Related Art

A semiconductor device that includes a wiring body, and a semiconductor chip arranged at the wiring body is disclosed in JP2013-197263.

SUMMARY OF THE INVENTION

One preferred embodiment of the present invention provides an electronic component including a substrate that includes a first principal surface, a second principal surface positioned on a side opposite to the first principal surface, a first side surface that connects the first principal surface and the second principal surface and that extends along a first direction, a second side surface that connects the first principal surface and the second principal surface and that extends along a second direction intersecting the first direction, and a corner portion that connects the first side surface and the second side surface and that has a curved surface curved outwardly, and a chip arranged at the first principal surface of the substrate.

One preferred embodiment of the present invention provides an electronic component including a substrate that includes a first principal surface, a second principal surface positioned on a side opposite to the first principal surface, a side surface that connects the first principal surface and the second principal surface, and a corner portion that connects the second side surface and the side surface and that has a curved surface curved outwardly, and a chip arranged at the first principal surface of the substrate.

One preferred embodiment of the present invention provides an electronic component including a substrate that includes a principal surface, a chip arranged at the principal surface of the substrate, and a sealing resin that seals the chip on the principal surface of the substrate and that includes a resin principal surface that faces the principal surface of the substrate, a first resin side surface that extends from the resin principal surface toward the substrate along a first direction, a second resin side surface that extends from the resin principal surface toward the substrate along a second direction intersecting the first direction, and a corner portion that connects the first resin side surface and the second resin side surface and that has a curved surface curved outwardly.

One preferred embodiment of the present invention provides an electronic component including a substrate that includes a principal surface, a chip arranged at the principal surface of the substrate, and a sealing resin that seals the chip on the principal surface of the substrate and that includes a resin principal surface that faces the principal surface of the substrate, a resin side surface that extends from the resin principal surface toward the substrate, and a corner portion that connects the resin principal surface and the resin side surface and that has a curved surface curved outwardly.

One preferred embodiment of the present invention provides a method for manufacturing an electronic component including the steps of preparing a wafer that has a principal surface, setting a plurality of component formation regions each of which has a first side extending along a first direction and a second side extending along a second direction intersecting the first direction to the principal surface of the wafer and arranging a chip in each of the plurality of component formation regions, and cutting out a plurality of electronic components by cutting the wafer along a peripheral edge of each of the component formation regions so that a corner portion connecting the first side and the second side is curved outwardly.

The aforementioned or other objects, features, and effects of the present invention will be clarified by the following description of preferred embodiments given below with reference to the accompanying drawings.

BRIEF DESCRIPTION OF THE DRAWINGS

FIG. 3 is a cross sectional view taken along line of FIG. 2.

FIG. 4A, FIG. 5A, FIG. 6A, FIG. 7A, FIG. 8A, FIG. 9A, FIG. 10A, FIG. 11A, FIG. 12A, FIG. 13A and FIG. 14A are views for explaining a method for manufacturing the electronic component of FIG. 1, and are enlarged plan views showing some of a plurality of component formation regions set at a wafer.

FIG. 4B, FIG. 5B, FIG. 6B, FIG. 7B, FIG. 8B, FIG. 9B, FIG. 10B, FIG. 11B, FIG. 12B, FIG. 13B and FIG. 14B are cross sectional views taken along line B-B of FIG. 4A, FIG. 5A, FIG. 6A, FIG. 7A, FIG. 8A, FIG. 9A, FIG. 10A, FIG. 11A, FIG. 12A, FIG. 13A and FIG. 14A.

DETAILED DESCRIPTION OF THE PREFERRED EMBODIMENTS

Figure 1:
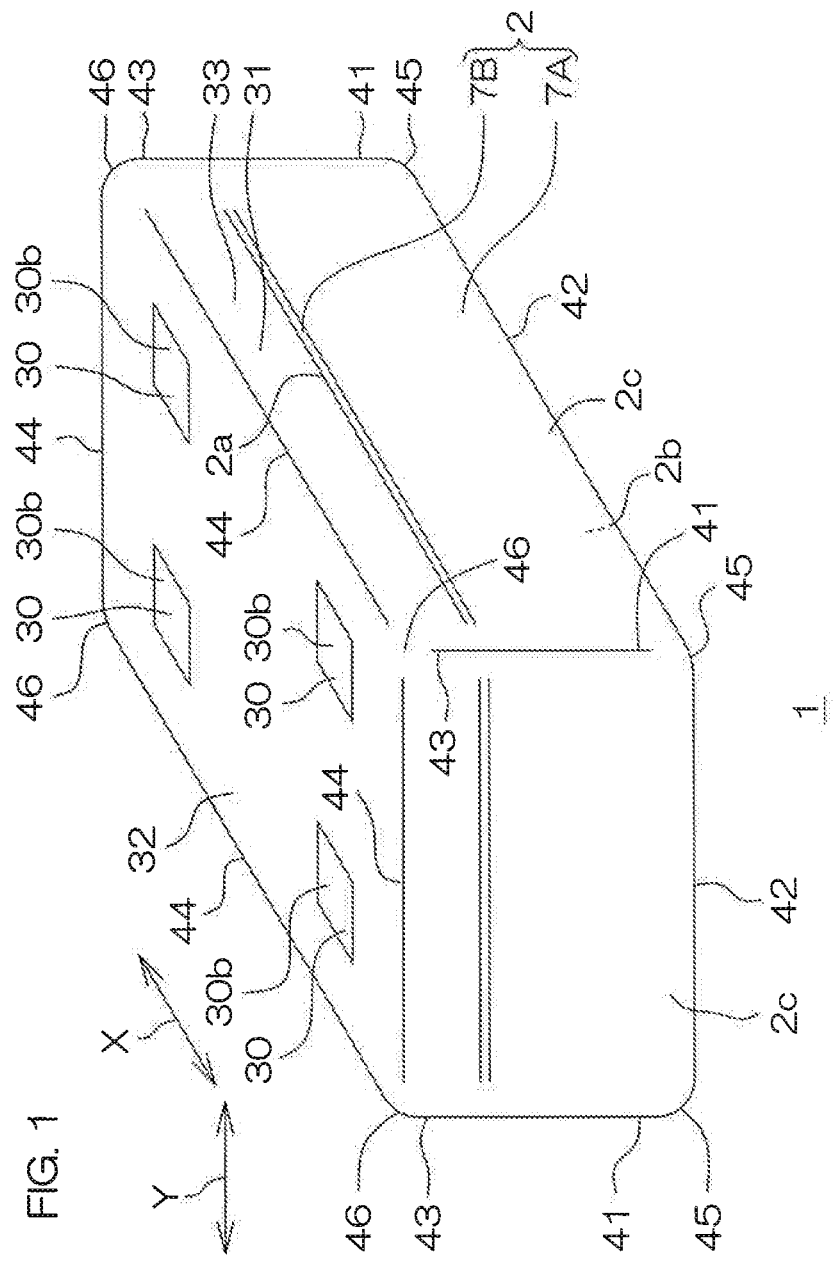
FIG. 1 is a perspective view of an electronic component according to a first preferred embodiment of the present invention.

An outer surface of the electronic component disclosed in JP2013-197263 has a corner portion whose tip is pointed. In a case where an external force or the like is applied to the outer surface of the electronic component, a crack or the like can be occurred from the corner as a starting point, and therefore a quality of the electronic component can be lowered.

One preferred embodiment of the present invention provides an electronic component capable of restraining an occurrence of a crack and provides a manufacturing method thereof.

One preferred embodiment of the present invention provides an electronic component including a substrate that includes a first principal surface, a second principal surface positioned on a side opposite to the first principal surface, a first side surface that connects the first principal surface and the second principal surface and that extends along a first direction, a second side surface that connects the first principal surface and the second principal surface and that extends along a second direction intersecting the first direction, and a corner portion that connects the first side surface and the second side surface and that has a curved surface curved outwardly, and a chip arranged at the first principal surface of the substrate.

According to the electronic component, the corner portion that connects the first side surface and the second side surface of the substrate has the curved surface. Therefore, even in a case where an external force is applied to the corner portion that connects the first side surface and the second side surface of the substrate, it is possible to disperse the external force along the curved surface of the corner portion. This makes it possible to restrain an occurrence of a crack starting from the corner portion that connects the first side surface and the second side surface of the substrate. Therefore, it is possible to provide an electronic component capable of restraining a deterioration in quality.

One preferred embodiment of the present invention provides an electronic component including a substrate that includes a first principal surface, a second principal surface positioned on a side opposite to the first principal surface, a side surface that connects the first principal surface and the second principal surface, and a corner portion that connects the second side surface and the side surface and that has a curved surface curved outwardly, and a chip arranged at the first principal surface of the substrate.

According to the electronic component, the corner portion that connects the second principal surface and the side surface of the substrate has the curved surface. Therefore, even in a case where an external force is applied to the corner portion that connects the second principal surface and the side surface of the substrate, it is possible to disperse the external force along the curved surface of the corner portion. This makes it possible to restrain an occurrence of a crack starting from the corner portion that connects the second principal surface and the side surface of the substrate. Therefore, it is possible to provide an electronic component capable of restraining a deterioration in quality.

One preferred embodiment of the present invention provides an electronic component including a substrate that includes a principal surface a chip arranged at the principal surface of the substrate, and a sealing resin that seals the chip on the principal surface of the substrate and that includes a resin principal surface that faces the principal surface of the substrate, a first resin side surface that extends from the resin principal surface toward the substrate along a first direction, a second resin side surface that extends from the resin principal surface toward the substrate along a second direction intersecting the first direction, and a corner portion that connects the first resin side surface and the second resin side surface and that has a curved surface curved outwardly.

According to the electronic component, the corner portion that connects the first resin side surface and the second resin side surface of the sealing resin has the curved surface. Therefore, even in a case where an external force is applied to the corner portion that connects the first resin side surface and the second resin side surface of the sealing resin, it is possible to disperse the external force along the curved surface of the corner portion. This makes it possible to restrain an occurrence of a crack starting from the corner portion that connects the first resin side surface and the second resin side surface of the sealing resin. Therefore, it is possible to provide an electronic component capable of restraining a deterioration in quality.

One preferred embodiment of the present invention provides an electronic component including a substrate that includes a principal surface, a chip arranged at the principal surface of the substrate, and a sealing resin that seals the chip on the principal surface of the substrate and that includes a resin principal surface that faces the principal surface of the substrate, a resin side surface that extends from the resin principal surface toward the substrate, and a corner portion that connects the resin principal surface and the resin side surface and that has a curved surface curved outwardly.

According to the electronic component, the corner portion that connects the resin principal surface and the resin side surface of the sealing resin has the curved surface. Therefore, even in a case where an external force is applied to the corner portion that connects the resin principal surface and the resin side surface of the sealing resin, it is possible to disperse the external force along the curved surface of the corner portion. This makes it possible to restrain an occurrence of a crack starting from the corner portion that connects the resin principal surface and the resin side surface of the sealing resin. Therefore, it is possible to provide an electronic component capable of restraining a deterioration in quality.

One preferred embodiment of the present invention provides a method for manufacturing an electronic component including the steps of preparing a wafer that has a principal surface, setting a plurality of component formation regions each of which has a first side extending along a first direction and a second side extending along a second direction intersecting the first direction to the principal surface of the wafer and arranging a chip in each of the plurality of component formation regions, and cutting out a plurality of electronic components by cutting the wafer along a peripheral edge of each of the component formation regions so that a corner portion connecting the first side and the second side is curved outwardly.

According to the manufacturing method of the electronic component, it is possible to manufacture a plurality of electronic components each of which includes a substrate cut out from the wafer. This substrate includes a first side surface that connects the first principal surface and the second principal surface and that extends along the first direction, a second side surface that connects the first principal surface and the second principal surface and that extends along the second direction, and a corner portion that connects the first side surface and the second side surface and that has a curved surface curved outwardly.

Therefore, even in a case where an external force is applied to the corner portion that connects the first side surface and the second side surface of the substrate in the electronic component manufactured by the method, it is possible to disperse the external force along the curved surface of the corner portion. This makes it possible to restrain an occurrence of a crack starting from the corner portion that connects the first side surface and the second side surface of the substrate. Therefore, it is possible to manufacture and provide an electronic component capable of restraining a deterioration in quality.

Preferred embodiments of the present invention will be hereinafter described in detail with reference to the accompanying drawings.

Figure 2:
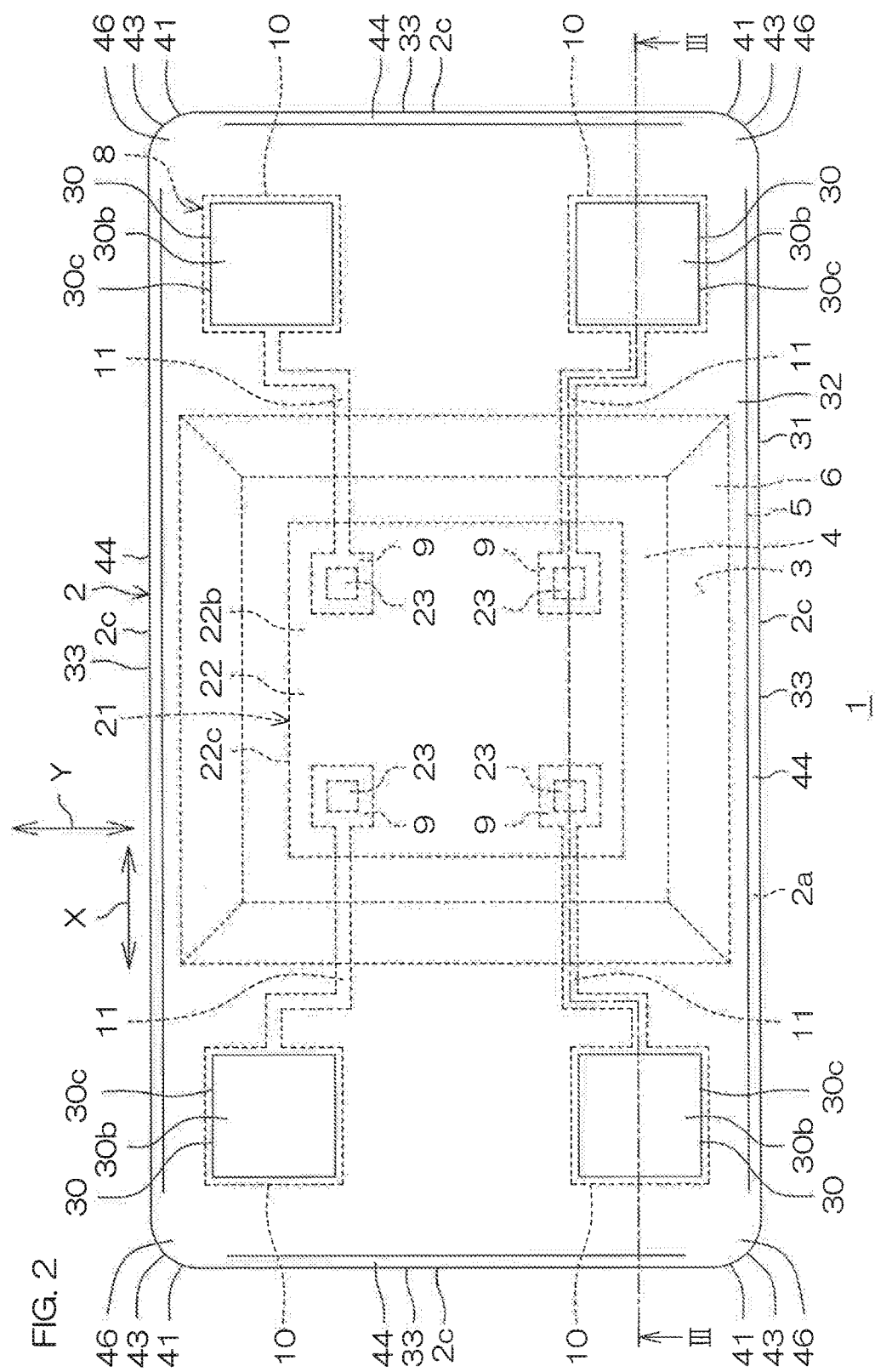
FIG. 2 is a plan view of the electronic component of FIG. 1.

FIG. 1 is a perspective view of an electronic component 1 according to a first preferred embodiment of the present invention. FIG. 2 is a plan view of the electronic component 1 of FIG. 1. FIG. 3 is a cross sectional view taken along line III-III of FIG. 2.

Referring to FIG. 1 to FIG. 3, the electronic component 1 includes an interposer 2 as a substrate for pitch conversion. The interposer 2 has a first principal surface 2a, a second principal surface 2b positioned on a side opposite to the first principal surface 2a, and side surfaces 2c that connect the first principal surface 2a and the second principal surface 2b.

The first principal surface 2a and the second principal surface 2b of the interposer 2 are each formed in a quadrilateral shape (a rectangular shape, in the present preferred embodiment) in plan view as viewed from their normal directions (hereinafter referred to simply as a "plan view").

A concave portion 3 that is hollowed toward the second principal surface 2b side is formed at the first principal surface 2a of the interposer 2. The second principal surface 2b of the interposer 2 is formed flatly.

The concave portion 3 is formed at a central portion of the first principal surface 2a of the interposer 2 so as to have an interval inwardly from a peripheral edge of the interposer 2. The concave portion 3 is formed in a quadrilateral shape parallel to each side of the interposer 2 in plan view.

The concave portion 3 may be formed in a polygonal shape, such as a triangular shape or a hexagonal shape, in plan view, instead of the quadrilateral shape. The concave portion 3 may be formed in a circular shape or an elliptical shape in plan view.

A low region portion 4 that is formed by a bottom portion of the concave portion 3, a high region portion 5 that is formed by a region surrounding the concave portion 3, and a connection portion 6 that connects the low region portion 4 and the high region portion 5 are formed at the first principal surface 2a of the interposer 2.

The low region portion 4 is formed in a quadrilateral shape parallel to each side of the interposer 2 in plan view. The high region portion 5 is formed in a quadrilateral ring shape that surrounds the concave portion 3 in plan view. The concave portion 3 is formed in a tapered shape in which a width of an opening gradually narrows from the high region portion 5 toward the low region portion 4 in a cross sectional view. The connection portion 6 has a slanted surface that is slanted downwardly from the high region portion 5 toward the low region portion 4.

Referring to FIG. 3, the interposer 2 includes a laminated structure that has a base body 7A and a surface insulating film 7B. The surface insulating film 7B covers a surface of the base body 7A. The base body 7A may include silicon. The surface insulating film 7B may include a nitride film (an SiN film) or an oxide film (an $SiO_2$ film).

The base body 7A may include an organic insulating material or an inorganic insulating material instead of silicon. The organic insulating material may include epoxy resin, polyimide resin, acrylic resin, or the like. The inorganic insulating material may include glass, ceramic, or the like. In a case where a base body 7A made of the insulating material is employed, the surface insulating film 7B may be excluded.

Referring to FIG. 2 and FIG. 3, a plurality of wiring films 8 (four wiring films 8, in the present preferred embodiment) are formed on the first principal surface 2a of the interposer 2. Each wiring film 8 extends over both an inner region and an outer region of the concave portion 3 at the first principal surface 2a of the interposer 2. Each wiring film 8 includes a first electrode pad film 9, a second electrode pad film 10, and a connection electrode film 11.

Four first electrode pad films 9 are formed at four corners of the low region portion 4 respectively, in the present preferred embodiment. Each first electrode pad film 9 is formed in a quadrilateral shape in plan view. Four second electrode pad films 10 are formed at four corners of the interposer 2 in the high region portion 5 respectively, in the present preferred embodiment. Each second electrode pad film 10 is formed in a quadrilateral shape in plan view.

The connection electrode film 11 connects the corresponding first electrode pad film 9 and the corresponding second electrode pad film 10. The connection electrode film 11 is linearly laid around so as to reach the second electrode pad film 10 from the first electrode pad film 9 across the connection portion 6.

Referring to FIG. 3, each wiring film 8 has a laminated structure including a seed layer 12 and a conductor layer 13 laminated in this order from the first principal surface 2a side of the interposer 2 in the present preferred embodiment.

The seed layer 12 has a laminated structure including a Ti film 14 and a Cu film 15 laminated in this order from the first principal surface 2a side of the interposer 2. The conductor layer 13 has a single layer structure that includes Cu in the present preferred embodiment. A thickness of the conductor layer 13 is larger than a thickness of the seed layer 12. The conductor layer 13 may be formed integrally with the Cu film 15 of the seed layer 12. The thick conductor layer 13 makes it possible to reduce the resistance value of the wiring film 8.

Referring to FIG. 1 to FIG. 3, a chip 21 is arranged at the first principal surface 2a of the interposer 2. The chip 21 is accommodated in the concave portion 3 of the interposer 2. The chip 21 includes a chip body 22 formed in a rectangular parallelepiped shape. The chip body 22 has a mounting surface 22a, a non-mounting surface 22b positioned on a side opposite to the mounting surface 22a, and a chip side surface 22c that connects the mounting surface 22a and the non-mounting surface 22b.

The chip body 22 may include silicon, GaAs (gallium arsenide), glass, or ceramic. The chip body 22 includes a functional element. The functional element may include at least one of a resistor, a capacitor, a coil, a diode, or a transistor.

A plurality (four pieces, in the present preferred embodiment) of terminal electrodes 23 to be electrically connected to the functional elements are formed on the mounting surface 22a of the chip body 22. No electrodes are formed on the non-mounting surface 22b of the chip body 22.

The mounting surface 22a of the chip body 22 may be covered with an insulating layer. A wiring layer including wires that electrically connect the terminal electrode 23 and the functional element may be formed in the insulating layer. The plurality of terminal electrodes 23 may protrude outwardly from the insulating layer.

Referring to FIG. 3, the chip 21 is arranged at the first principal surface 2a of the interposer 2 in a posture in which the mounting surface 22a faces the low region portion 4. The terminal electrode 23 of the chip 21 is bonded to the first electrode pad film 9 of a corresponding wiring film 8 via a conductive bonding material 24. The conductive bonding material 24 may include a solder or a metallic paste.

The concave portion 3 of the interposer 2 has a depth where both the mounting surface 22a and the non-mounting surface 22b of the chip 21 are positioned closer to the low region portion 4 than the high region portion 5 of the interposer 2 in the present preferred embodiment. Therefore, the mounting surface 22a and the non-mounting surface 22b of the chip 21 are positioned in a region between the low region portion 4 and the high region portion 5 of the interposer 2 inside the concave portion 3.

Each of the mounting surface 22a and the non-mounting surface 22b of the chip 21 have an area smaller than an area of the low region portion 4 in plan view. A whole area of the mounting surface 22a of the chip 21 faces the low region portion 4. Therefore, the whole area of the mounting surface 22a of the chip 21 is positioned in a region surrounded by a peripheral edge of the low region portion 4.

In a first mode example, the mounting surface 22a of the chip 21 may be positioned inside the concave portion 3, while the non-mounting surface 22b of the chip 21 may be positioned above the high region portion 5. In a second mode example, each of the mounting surface 22a and the non-mounting surface 22b of the chip 21 may be has an area larger than an area of the low region portion 4 in plan view. In a third mode example, the mounting surface 22a of the chip 21 may face a part of the connection portion 6 in addition to the low region portion 4.

Referring to FIG. 1 to FIG. 3, an external terminal 30 to be externally connected is formed on the second electrode pad film 10 in each of the plurality of wiring films 8. The external terminal 30 includes a pillar electrode erected upwardly in a block shape or in a column shape on each second electrode pad film 10.

Each external terminal 30 has an end surface 30a, an opposite end surface 30b positioned on a side opposite to the end surface 30a, and a side surface 30c that connects the end surface 30a and the opposite end surface 30b. The end surface 30a of each external terminal 30 is connected to the corresponding second electrode pad film 10.

A sealing resin 31 that seals the chip 21 is formed on the first principal surface 2a of the interposer 2. The sealing resin 31 may include epoxy resin, polyimide resin, or acrylic resin.

The sealing resin 31 covers an outer surface of the chip 21, and exposes the opposite end surface 30b of each external terminal 30. More specifically, the sealing resin 31 covers a whole area of the mounting surface 22a, the non-mounting surface 22b, and the chip side surface 22c of the chip 21, and a whole area of the side surface 30c of each external terminal 30. The sealing resin 31 has a resin principal surface 32 and a resin side surface 33.

The resin principal surface 32 of the sealing resin 31 faces the first principal surface 2a of the interposer 2 across the chip 2l. The resin principal surface 32 of the sealing resin 31 is formed so as to have a flat surface parallel to the second principal surface 2b of the interposer 2.

The resin principal surface 32 of the sealing resin 31 is formed so as to be flush with respect to the opposite end surface 30b of each external terminal 30. That is, the resin principal surface 32 of the sealing resin 31 is formed in a quadrilateral shape that matches the first principal surface 2a of the interposer 2 in plan view.

The resin side surface 33 of the sealing resin 31 extends from a peripheral edge of the resin principal surface 32 toward the interposer 2, and is connected to the side surface 2c of the interposer 2. The resin side surface 33 of the sealing resin 31 is formed so as to be flush with respect to the side surface 2c of the interposer 2.

The shape of the interposer 2 and the shape of the sealing resin 31 will be described more specifically. For descriptive convenience, a longitudinal direction of the interposer 2 is hereinafter referred to as a "first direction X." A transverse direction of the interposer 2 is hereinafter referred to as a "second direction Y." The second direction Y is a direction perpendicular to the first direction X.

The interposer 2 includes a first corner portion 41 that connects the side surface 2c extending along the first direction X and the side surface 2c extending along the second direction Y. The interposer 2 includes a second corner portion 42 that connects the second principal surface 2b and the side surfaces 2c. The interposer 2 includes a top portion 45 that connects the first corner portion 41 and the second corner portion 42.

Referring to FIG. 1 and FIG. 2, the first corner portion 41 of the interposer 2 is subjected to round chamfering. The first corner portion 41 is thus formed in a round shape so as to curve toward an outside of the interposer 2. The first corner portion 41 has a curved surface that is curved toward the outside of the interposer 2. More specifically, the curved surface of the first corner portion 41 includes a convex curved surface having a circular arc shape.

Referring to FIG. 1 and FIG. 3, the second corner portion 42 of the interposer 2 is subjected to round chamfering. The second corner portion 42 is thus formed in a round shape so as to curve toward the outside of the interposer 2. The second corner portion 42 has a curved surface that is curved toward the outside of the interposer 2. More specifically, the curved surface of the second corner portion 42 includes a convex curved surface having a circular arc shape.

Referring to FIG. 1 to FIG. 3, the top portion 45 of the interposer 2 is subjected to round chamfering. The top portion 45 is thus formed in a round shape so as to curve toward the outside of the interposer 2. The top portion 45 has a curved surface that is curved toward the outside of the interposer 2. More specifically, the curved surface of the top portion 45 includes a convex curved surface having a circular arc shape.

The sealing resin 31 includes a first resin corner portion 43 that connects the resin side surface 33 extending along the first direction X and the resin side surface 33 extending along the second direction Y. The sealing resin 31 includes a second resin corner portion 44 that connects the resin principal surface 32 and the resin side surfaces 33. The sealing resin 31 includes a resin top portion 46 that connects the first resin corner portion 43 and the second resin corner portion 44.

Referring to FIG. 1 and FIG. 2, the first resin corner portion 43 of the sealing resin 31 is subjected to round chamfering. The first resin corner portion 43 is thus formed in a round shape so as to curve toward an outside of the sealing resin 31. The first resin corner portion 43 has a curved surface that is curved toward the outside of the sealing resin 31. More specifically, the curved surface of the first resin corner portion 43 includes a convex curved surface having a circular arc shape.

Referring to FIG. 1 and FIG. 3, the second resin corner portion 44 of the resin side surface 33 is subjected to round chamfering. The second resin corner portion 44 is thus formed in a round shape so as to curve toward the outside of the resin side surface 33. The second resin corner portion 44 has a curved surface that is curved toward the outside of the resin side surface 33. More specifically, the curved surface of the second resin corner portion 44 includes a convex curved surface having a circular arc shape.

Referring to FIG. 1 to FIG. 3, the resin top portion 46 of the sealing resin 31 is subjected to round chamfering. The resin top portion 46 is thus formed in a round shape so as to curve toward the outside of the sealing resin 31. The resin top portion 46 has a curved surface that is curved toward the outside of the sealing resin 31. More specifically, the curved surface of the resin top portion 46 includes a convex curved surface having a circular arc shape.

FIG. 4A to FIG. 14A are views for explaining a method for manufacturing the electronic component 1 of FIG. 1. FIG. 4A to FIG. 14A are enlarged plan views showing two regions arranged in the first direction X among a plurality of component formation regions 52 (described below) set at a wafer 51. FIG. 4B to FIG. 14B are cross sectional views taken along line B-B of FIG. 4A to FIG. 14A.

Figure 4A:
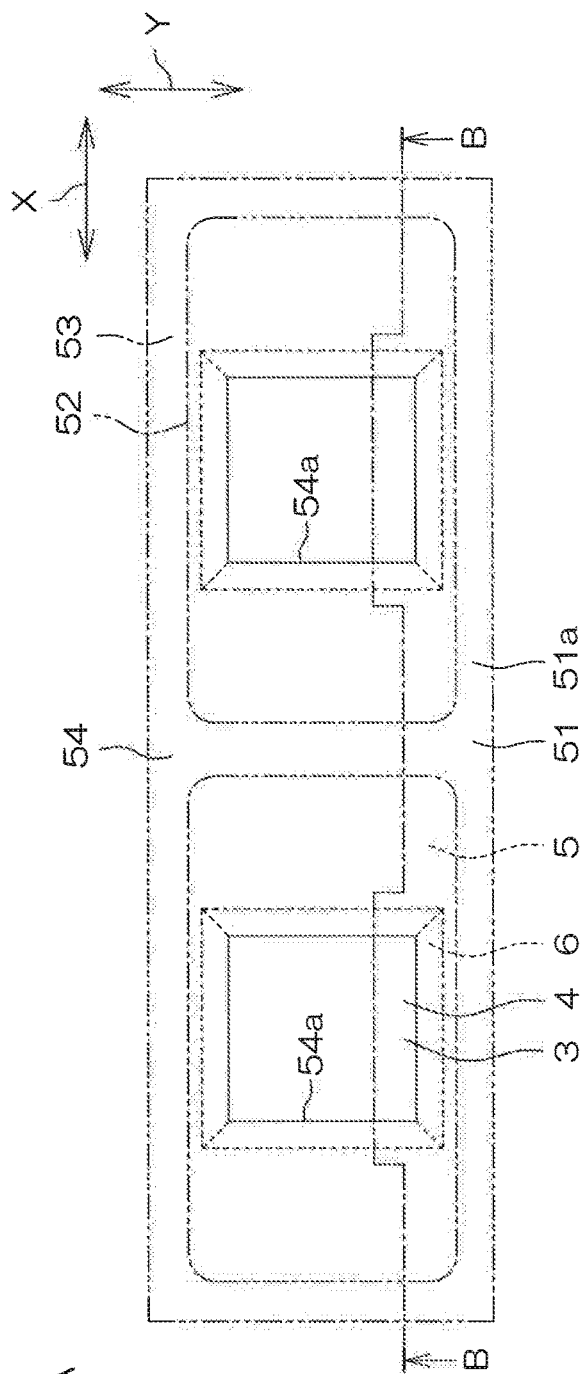
Figure 4B:
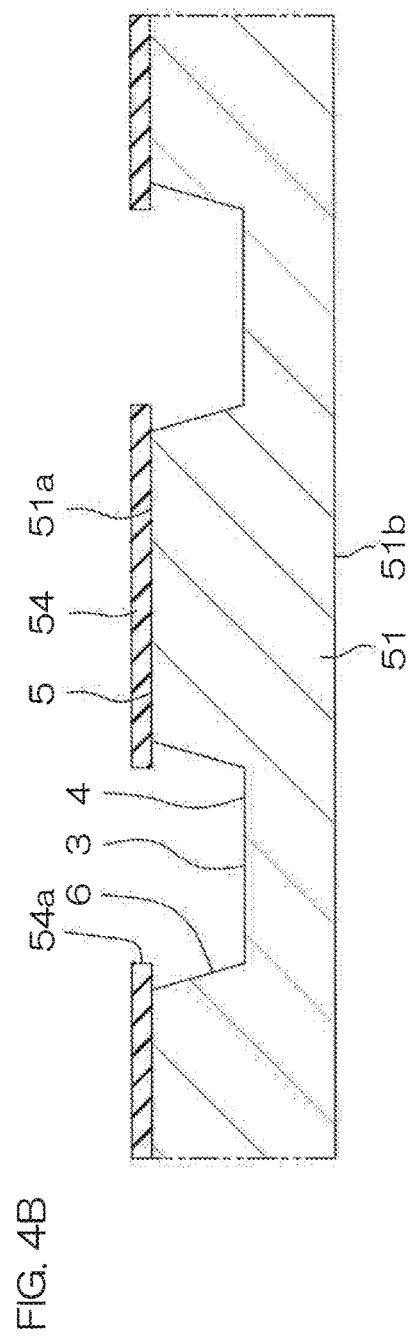

Referring to FIG. 4A and FIG. 4B, a single wafer 51 made of silicon to be a base of the interposer 2 is prepared. The wafer 51 may be formed in a disk shape.

The wafer 51 has a first principal surface 51a and a second principal surface 51b. The first principal surface 51a and the second principal surface 51b of the wafer 51 correspond to the first principal surface 2a and the second principal surface 2b of the interposer 2, respectively.

A plurality of component formation regions 52 in each of which the electronic component 1 is to be formed are set at the first principal surface 51a of the wafer 51. The plurality of component formation regions 52 are each set in a quadrilateral shape in plan view.

The plurality of component formation regions 52 may be set in a matrix pattern so as to be spaced out along the first direction X and in the second direction Y in plan view. The plurality of component formation regions 52 may be defined by a scribe region 53 extending in a grid shaped pattern in plan view.

Next, the concave portion 3 is formed in each of the plurality of component formation regions 52. In this step, first, a mask 54 that has a predetermined pattern is formed on the first principal surface 51a of the wafer 51. The mask 54 has openings 54a each of which exposes a region in which the concave portion 3 is to be formed.

Next, parts of the wafer 51 exposed from the mask 54 are selectively removed by, for example, an isotropic etching method via the mask 54. The first principal surface 51a of the wafer 51 is thereby dug down toward the second principal surface 51b.

The isotropic etching method may be a wet etching method. According to the isotropic etching method, unnecessary portions of the wafer 51 are removed in a thickness direction of the wafer 51 and in a direction perpendicular to the thickness direction (i.e., a direction parallel to the first principal surface 51a). A removal amount at an opening side of the concave portion 3 is greater than a removal amount at a bottom portion side of the concave portion 3 in the wafer 51.

The concave portion 3 that has an opening width greater than an opening width of the opening 54a of the mask 54 is thereby formed. The concave portion 3 is formed so that the opening width gradually narrows from the first principal surface 51a side toward the second principal surface 51b side of the wafer 51.

Through those steps, the low region portion 4 that is formed by the bottom portion of the concave portion 3, the high region portion 5 that is formed by a region surrounding the concave portion 3, and the connection portion 6 that connects the low region portion 4 and the high region portion 5 are formed at the first principal surface 51a of the wafer 51.

Figure 5A:
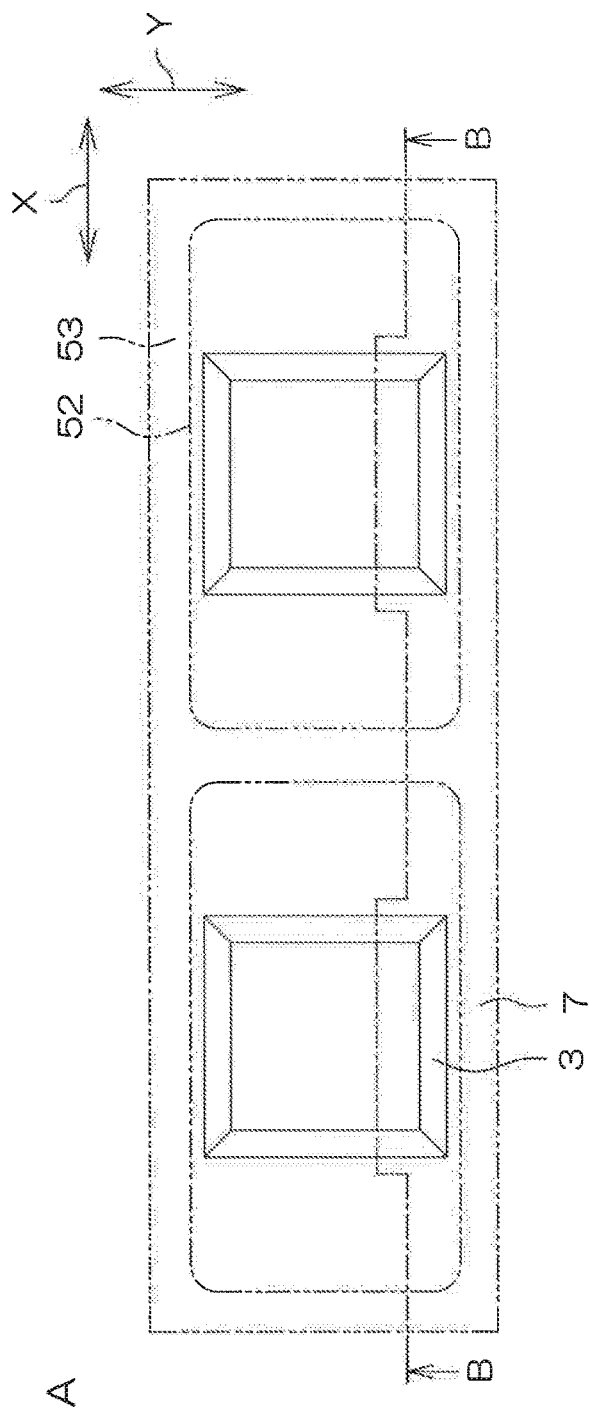
Figure 5B:
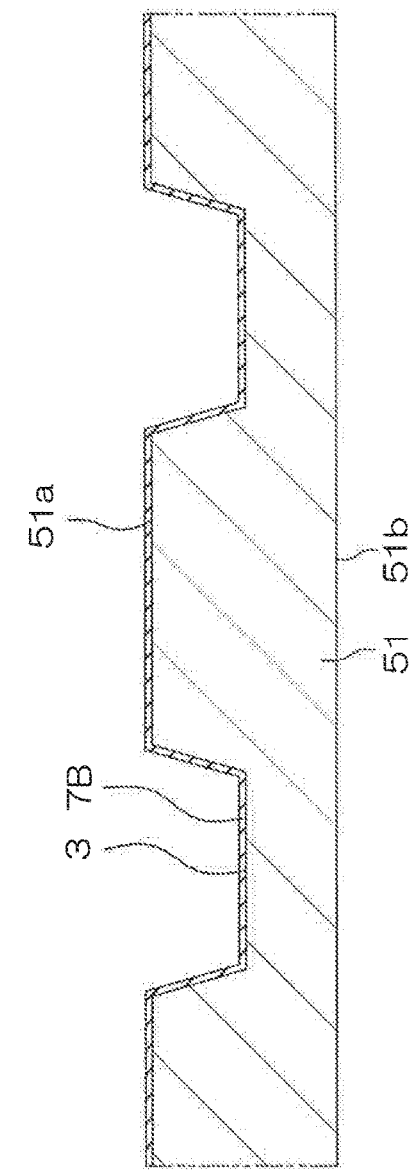

Next, referring to FIG. 5A and FIG. 5B, the surface insulating film 7B is formed at the first principal surface 51a of the wafer 51. The surface insulating film 7B including a silicon oxide is formed in the present preferred embodiment. The surface insulating film 7B may be formed by a thermal oxidation treatment or by a CVD (Chemical Vapor Deposition) method.

Next, referring to FIG. 6A and FIG. 6B, the wiring film 8 is formed in each of the plurality of component formation regions 52. In this step, first, the seed layer 12 (not shown) including the Ti film 14 and the Cu film 15 is formed. The Ti film 14 and the Cu film 15 are formed by depositing Ti and Cu in this order on a whole area of the surface insulating film 7B by a sputtering method.

Next, a mask 55 having a predetermined pattern is formed on the seed layer 12. The mask 55 has openings 55a each of which exposes a region where each of the plurality of wiring films 8 is to be formed. For clarity, the mask 55 is shown by dot hatching in FIG. 6A.

Next, the conductor layer 13 is formed on the seed layer 12. The conductor layer 13 is formed on the seed layer 12 exposed from the opening 55a of the mask 55 by an electrolytic copper plating method. Thereafter, the mask 55 is removed. Next, an unnecessary portion of the seed layer 12 exposed from the conductor layer 13 is removed. The plurality of wiring films 8 each of which has a predetermined pattern are thereby formed.

A step of forming the wiring film 8 serves also as a step of forming a dummy wiring film 56 on the scribe region 53. The dummy wiring film 56 is formed so as to be in an electrically floating state.

More specifically, the mask 55 includes an opening 55b that exposes a region in which the dummy wiring film 56 is to be formed in the seed layer 12. The opening 55b of the mask 55 is formed in a grid shaped pattern that matches the scribe region 53 in plan view.

Cu is plated onto the seed layer 12 exposed from the opening 55b of the mask 55, in the step of forming the conductor layer 13. The dummy wiring film 56 having a predetermined pattern including the seed layer 12 and the conductor layer 13 is thereby formed.

More specifically, the dummy wiring film 56 is formed in a grid shaped pattern that matches the opening 55b of the mask 55 in plan view. The plurality of component formation regions 52 is defined by an inner wall of the dummy wiring film 56.

The dummy wiring film 56 includes a first inner wall extending along the first direction X and a second inner wall extending along the second direction Y. The dummy wiring film 56 includes a corner portion 56a that connects the first inner wall and the second inner wall. The corner portion 56a of the dummy wiring film 56 is formed in a round shape toward an outside of the component formation region 52.

Next, referring to FIG. 7A and FIG. 7B, a mask 57 having a predetermined pattern is formed on the surface insulating film 7B. The mask 57 has a quadrangular opening 57a that matches the second electrode pad film 10 in plan view. For clarity, the mask 57 is shown by dot hatching in FIG. 7A.

Next, referring to FIG. 8A and FIG. 8B, the external terminal 30 is formed on each of the plurality of second electrode pad films 10 exposed from the opening 57a of the mask 57. For clarity, the mask 57 is shown by dot hatching in FIG. 8A. For clarity, the external terminal 30 is also shown by cross hatching in FIG. 8A.

In this step, Cu is plated to a surface of the second electrode pad film 10 exposed from the opening 57a of the mask 57 by, for example, an electrolytic copper plating method. The external terminal 30 including a pillar electrode having a block shape or a column shape is thereby formed.

The step of forming the external terminal 30 serves also as a step of forming a dummy external terminal 58 on the dummy wiring film 56. The dummy external terminal 58 is formed so as to be in an electrically floating state.

More specifically, the mask 57 includes an opening 57b that exposes the dummy wiring film 56 formed on the scribe region 53. The opening 57b of the mask 57 is formed in a grid shaped pattern so as to match the dummy wiring film 56 in plan view.

Cu is plated to a surface of the dummy wiring film 56 exposed from the opening 57b of the mask 57 in the step of forming the external terminal 30. The dummy external terminal 58 is thereby formed. A thickness of the dummy external terminal 58 is substantially equal to a thickness of the external terminal 30. For clarity, the dummy external terminal 58 is shown by cross hatching in FIG. 8A.

The dummy external terminal 58 is formed in a grid shaped pattern so as to match the opening 57b of the mask 57 in plan view. The plurality of component formation regions 52 is defined by an inner wall of the dummy external terminal 58.

The dummy external terminal 58 includes a first inner wall extending along the first direction X and a second inner wall extending along the second direction Y. The dummy external terminal 58 includes a corner portion 58a that connects the first inner wall and the second inner wall. The corner portion 58a of the dummy external terminal 58 is formed in a round shape toward the outside of the component formation region 52. The mask 57 is removed after the external terminal 30 and the dummy external terminal 58 are formed.

Next, referring to FIG. 9A and FIG. 9B, the chip 21 is arranged to each of the plurality of component formation regions 52. The arrangement of the chip 21 and the connection mode of the chip 21 with respect to the wafer 51 are the same as in FIG. 1 to FIG. 3, and therefore the descriptions thereof will be omitted.

Next, referring to FIG. 10A and FIG. 10B, the sealing resin 31 is supplied to the first principal surface 51a of the wafer 51. For clarity, the sealing resin 31 is shown by dot hatching in FIG. 10A.

The chip 21, the external terminal 30, and the dummy external terminal 58 are sealed with the sealing resin 31. In this step, a whole area of an outer surface of the external terminal 30 and a whole area of an outer surface of the dummy external terminal 58 and a whole area of the outer surface of chip 21 are covered with the sealing resin 31.

Next, referring to FIG. 11A and FIG. 11B, the resin principal surface 32 of the sealing resin 31 is ground. The resin principal surface 32 of the sealing resin 31 is ground until the external terminal 30 and the dummy external terminal 58 are exposed.

For clarity, the sealing resin 31 is shown by dot hatching in FIG. 11A. For clarity, the external terminal 30 and the dummy external terminal 58 are also shown by cross hatching in FIG. 11A.

The opposite end surface 30b of the external terminal 30 is formed so as to be flush with respect to the resin principal surface 32 of the sealing resin 31. The opposite end surface of the dummy external terminal 58 is also formed so as to be flush with respect to the resin principal surface 32 of the sealing resin 31.

Figure 12A:
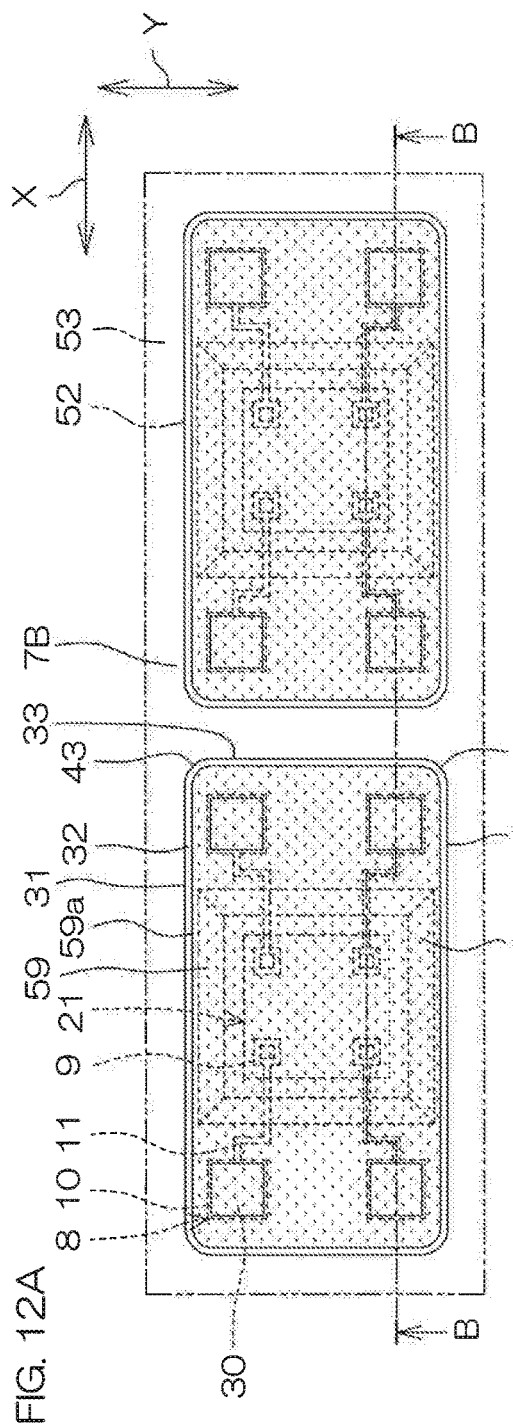
Figure 12B:
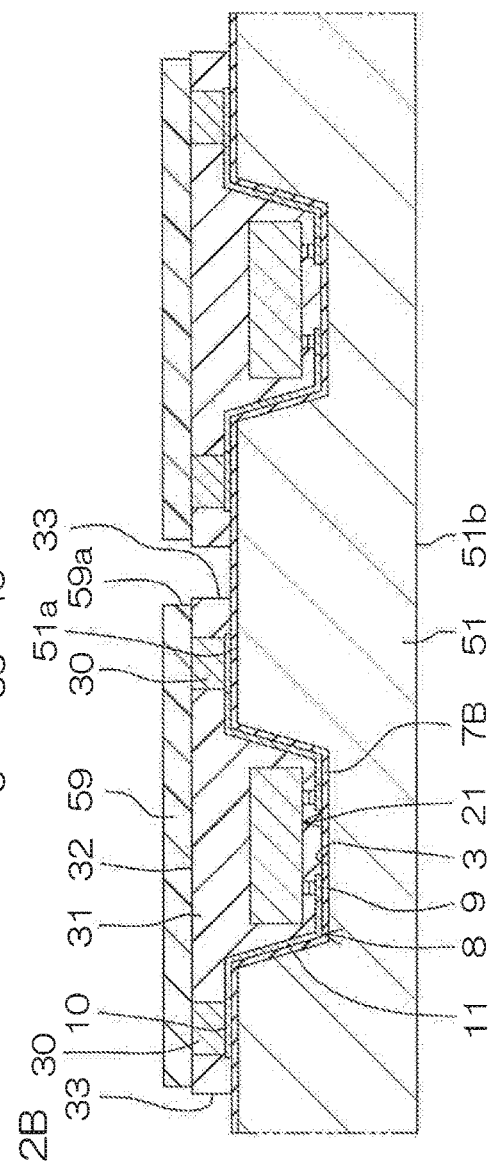

Next, referring to FIG. 12A and FIG. 12B, a mask 59 having a predetermined pattern is formed on the resin principal surface 32 of the sealing resin 31. For clarity, the mask 59 is shown by dot hatching in FIG. 12A. The mask 59 has an opening 59a that is formed in a grid shaped pattern and that exposes the dummy external terminal 58 in plan view.

An inner wall surface defining the opening 59a of the mask 59 is positioned at the component formation region 52 side with respect to a boundary portion between the dummy external terminal 58 and the sealing resin 31. Therefore, a peripheral edge of the sealing resin 31 is exposed from the mask 59. More specifically, the peripheral edge of the sealing resin 31 is exposed in a quadrilateral ring shape along a peripheral edge of the mask 59 in plan view.

Next, the dummy wiring film 56 and the dummy external terminal 58 are removed. The dummy wiring film 56 and the dummy external terminal 58 are removed by an etching method via the mask 59. The etching method may be a wet etching method. The sealing resin 31 having a predetermined shape is thereby formed.

More specifically, the sealing resin 31 includes the resin side surface 33 extending along the first direction X and the resin side surface 33 extending along the second direction Y. The first resin corner portion 43 that connects the resin side surface 33 extending along the first direction X and the resin side surface 33 extending along the second direction Y is formed in a curved surface that is curved toward the outside of the sealing resin 31.

As thus described, the sealing resin 31 is formed along the inner wall of the dummy wiring film 56 and the inner wall of the dummy external terminal 58. That is, the dummy wiring film 56 and the dummy external terminal 58 are each formed as a mask to form the sealing resin 31 having a predetermined shape.

The dummy wiring film 56 can be formed by using the step of forming the wiring film 8. The dummy external terminal 58 can be formed by using the step of forming the external terminal 30. Therefore, an increase in man-hour resulting from the formation of the sealing resin 31 can thus be restrained.

Figure 13A:
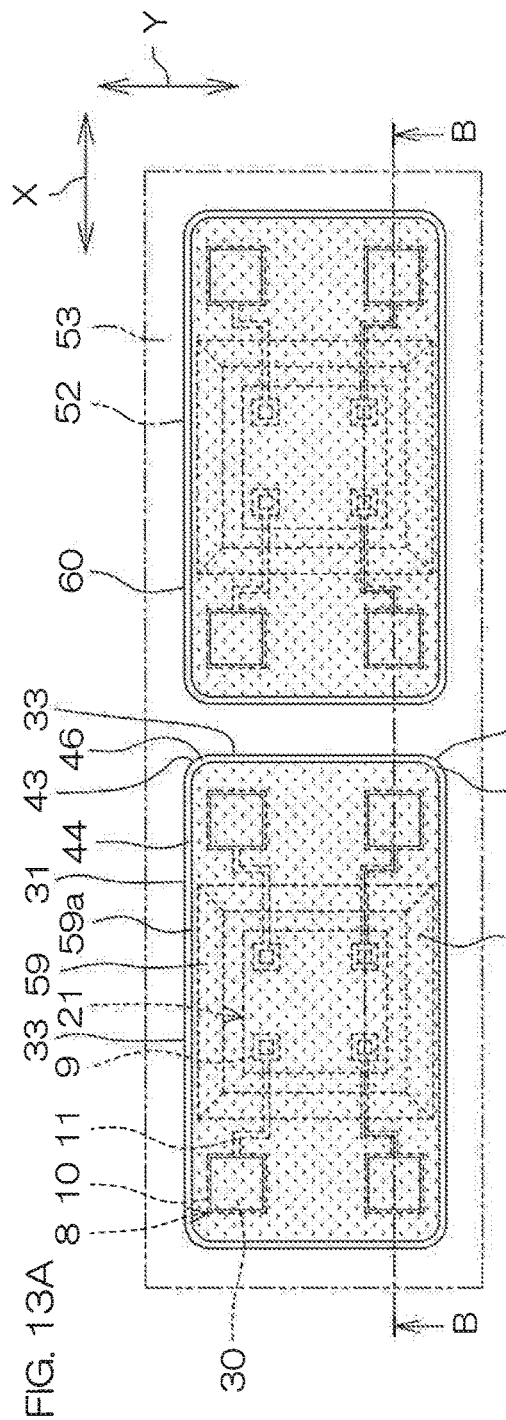
Figure 13B:
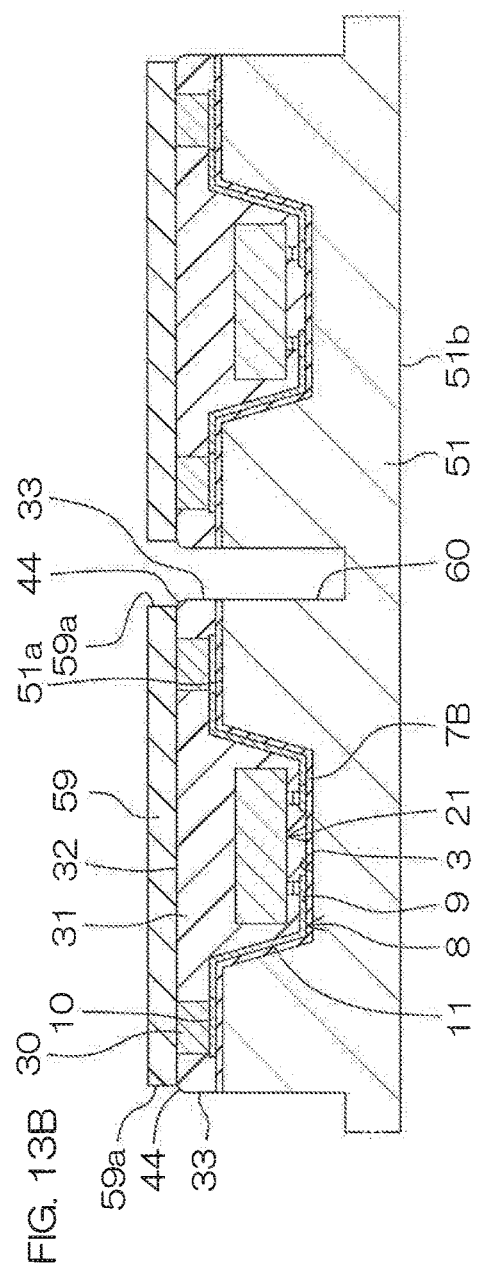

Next, referring to FIG. 13A and FIG. 13B, a groove 60 is formed along the scribe region 53. The groove 60 is formed by selectively removing the surface insulating film 7B and the wafer 51.

The surface insulating film 7B and the wafer 51 may be removed by an etching method via the mask 59. The etching method may be an anisotropic etching method. The anisotropic etching method may be a dry etching method such as a Reactive Ion Etching (RIE) method.

In this step, the wafer 51 is removed to a midway portion in a thickness direction toward the second principal surface 51b from the first principal surface 51a after the surface insulating film 7B is removed. The groove 60 of a grid shaped pattern that substantially matches the scribe region 53 in plan view is formed. The groove 60 has a wall surface that is flush with respect to the resin side surface 33 of the sealing resin 31.

In this step, the sealing resin 31 exposed from the opening 59a of the mask 59 is also partially removed. More specifically, the second resin corner portion 44 that connects the resin principal surface 32 and the resin side surface 33 of the sealing resin 31 is also partially removed. The resin top portion 46 that connects the first resin corner portion 43 and the second resin corner portion 44 of the sealing resin 31 is also partially removed.

The second resin corner portion 44 and the resin top portion 46 of the sealing resin 31 may be removed at an etching rate lower than an etching rate of the wafer 51.

Through those steps, the second resin corner portion 44 having the curved surface and the resin top portion 46 having the curved surface are formed. That is, the step of forming the groove 60 serves also as a step of forming the second resin corner portion 44 having the curved surface and a step of forming the resin top portion 46 having the curved surface. After the groove 60 is formed, the mask 59 is removed.

Next, referring to FIG. 14A and FIG. 14B, a supporting tape 61 that supports the wafer 51 is stuck to the first principal surface 51a side of the wafer 51. The supporting tape 61 may be a resin tape.

Next, the second principal surface 51b of the wafer 51 is ground by a grinding method until the second principal surface 51b communicates with the groove 60. The grinding method may include a Chemical Mechanical Polishing (CMP) method that uses slurry (abrasive). The wafer 51 is thereby cut along the peripheral edge of the sealing resin 31.

The wafer 51 and the surface insulating film 7B become the interposer 2 through the cutting step. A part forming the inner wall surface of the groove 60 becomes the side surfaces 2c of the interposer 2. Therefore, the interposer 2 in which the first corner portion 41 that connects the side surface 2c extending along the first direction X and the side surface 2c extending along the second direction Y has a curved surface is formed.

The second principal surface 51b of the wafer 51 is continuously ground after the wafer 51 is cut. Therefore, the second corner portion 42 that connects the second principal surface 2b and the side surface 2c in the interposer 2 is partially removed by the abrasive. The top portion 45 that connects the first corner portion 41 and the second corner portion 42 in the interposer 2 is also partially removed by the abrasive.

The interposer 2 in which the second corner portion 42 has the curved surface and in which the top portion 45 has the curved surface is formed. That is, the step of cutting the wafer 51 serves also as a step of forming the second corner portion 42 having the curved surface and the top portion 45 having the curved surface. Thereafter, the electronic component 1 after the individualized is separated from the supporting tape 61. The electronic component 1 is manufactured through those steps.

As described above, according to the electronic component 1, the first corner portion 41 of the interposer 2 has the curved surface that is curved toward the outside of the interposer 2. Therefore, even in a case where an external force is applied to the first corner portion 41, it is possible to disperse the external force along the curved surface of the first corner portion 41. This makes it possible to restrain the occurrence of a crack starting from the first corner portion 41.

According to the electronic component 1, the second corner portion 42 of the interposer 2 has the curved surface that is curved toward the outside of the interposer 2. Therefore, even in a case where an external force is applied to the second corner portion 42, it is possible to disperse the external force along the curved surface of the second corner portion 42. This makes it possible to restrain the occurrence of a crack starting from the second corner portion 42.

According to the electronic component 1, the first resin corner portion 43 of the sealing resin 31 has the curved surface that is curved toward the outside of the sealing resin 31. Therefore, even in a case where an external force is applied to the first resin corner portion 43, it is possible to disperse the external force along the curved surface of the first resin corner portion 43. This makes it possible to restrain an occurrence of a crack starting from the first resin corner portion 43.

According to the electronic component 1, the second resin corner portion 44 of the sealing resin 31 has the curved surface that is curved toward the outside of the sealing resin 31. Therefore, even in a case where an external force is applied to the second resin corner portion 44, it is possible to disperse the external force along the curved surface of the second resin corner portion 44. This makes it possible to restrain the occurrence of a crack starting from the second resin corner portion 44.

According to the electronic component 1, the top portion 45 that connects the first corner portion 41 and the second corner portion 42 of the interposer 2 has the curved surface that is curved toward the outside of the interposer 2. Therefore, even in a case where an external force is applied to the top portion 45, it is possible to disperse the external force along the curved surface of the top portion 45. This makes it possible to restrain the occurrence of a crack starting from the top portion 45.

According to the electronic component 1, the resin top portion 46 that connects the first resin corner portion 43 and the second resin corner portion 44 of the sealing resin 31 has the curved surface that is curved toward the outside of the sealing resin 31. Therefore, even in a case where an external force is applied to the resin top portion 46, it is possible to disperse the external force along the curved surface of the resin top portion 46. This makes it possible to restrain the occurrence of a crack starting from the resin top portion 46.

Therefore, according to the electronic component 1, it is possible to restrain the occurrence of a crack starting from the first corner portion 41, from the second corner portion 42, from the top portion 45, from the first resin corner portion 43, from the second resin corner portion 44, and/or from the resin top portion 46. This makes it possible to provide an electronic component 1 capable of restraining a deterioration in quality.

According to the electronic component 1, the chip 21 is accommodated in the concave portion 3 of the interposer 2. This makes it possible to reduce the distance between the second principal surface 2b of the interposer 2 and the non-mounting surface 22b of the chip 21 by an amount corresponding to the depth of the concave portion 3 formed at the interposer 2. Therefore, it is possible to reduce the size of the electronic component 1 by achieving a low profile.

Figure 15:
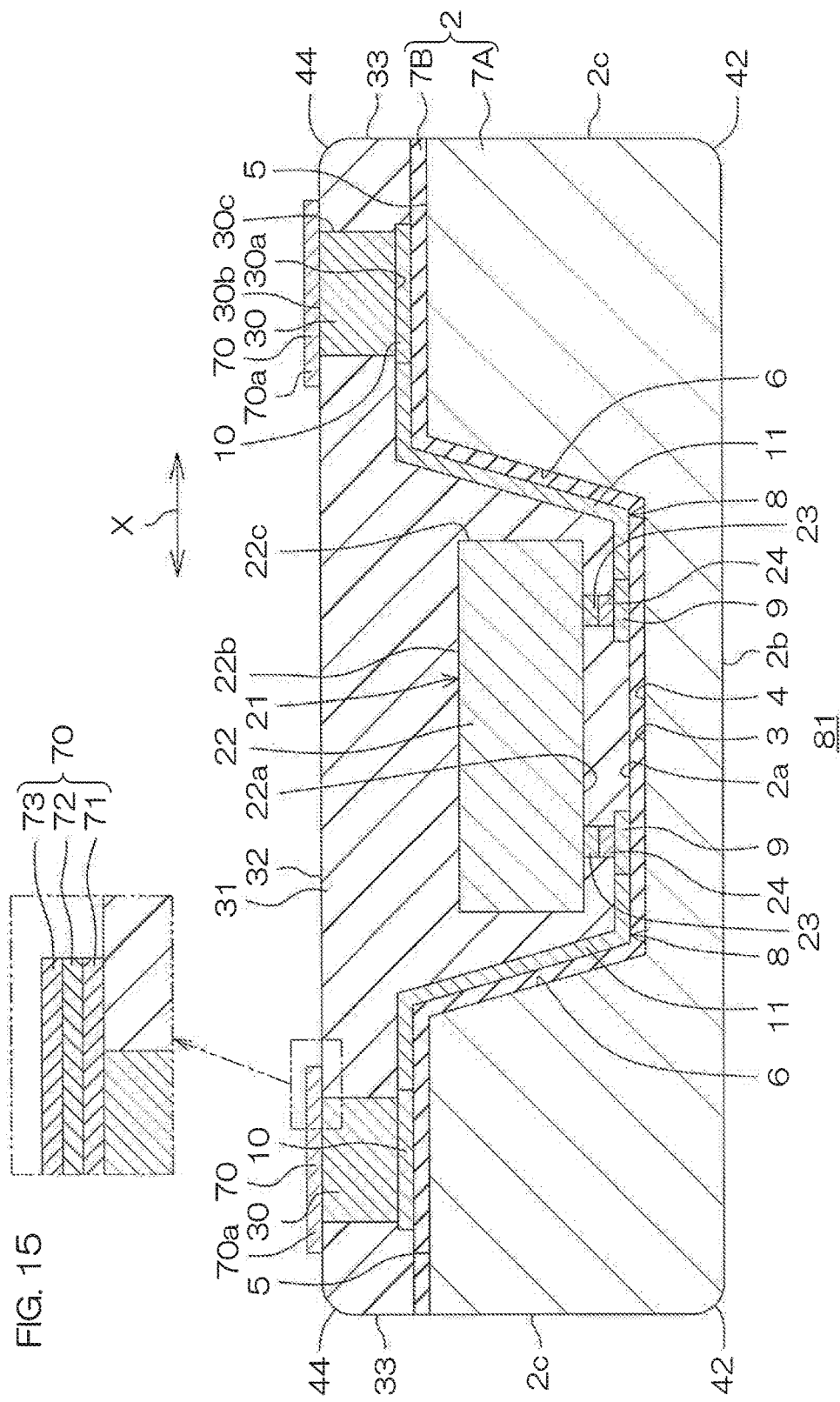
FIG. 15 is a cross sectional view of an electronic component according to a second preferred embodiment of the present invention.

FIG. 15 is a cross sectional view of an electronic component 81 according to a second preferred embodiment of the present invention.

In FIG. 15, the same reference sign is given to a constituent equivalent to each constituent of the first preferred embodiment described above, and descriptions thereof will be omitted.

Referring to FIG. 15, the electronic component 81 includes an electrode layer 70 formed on each of the plurality of external terminals 30. The electrode layer 70 covers the opposite end surface 30b of each of the plurality of external terminals 30.

The electrode layer 70 may have a laminated structure in which a plurality of electrode films are laminated from the opposite end surface 30b side of the external terminal 30. The plurality of electrode films may include an Ni film 71, a Pd film 72, and an Au film 73 laminated in this order from the opposite end surface 30b side of the external terminal 30.

The electrode layer 70 covers a whole area of the opposite end surface 30b of the external terminal 30. The electrode layer 70 may have an overlap portion 70a that overlaps to the resin principal surface 32 of the sealing resin 31. The electrode layer 70 may be formed in a quadrilateral shape in plan view.

As described above, likewise, the electronic component 81 makes it possible to fulfill the same effect as in the first preferred embodiment.

Figure 16:
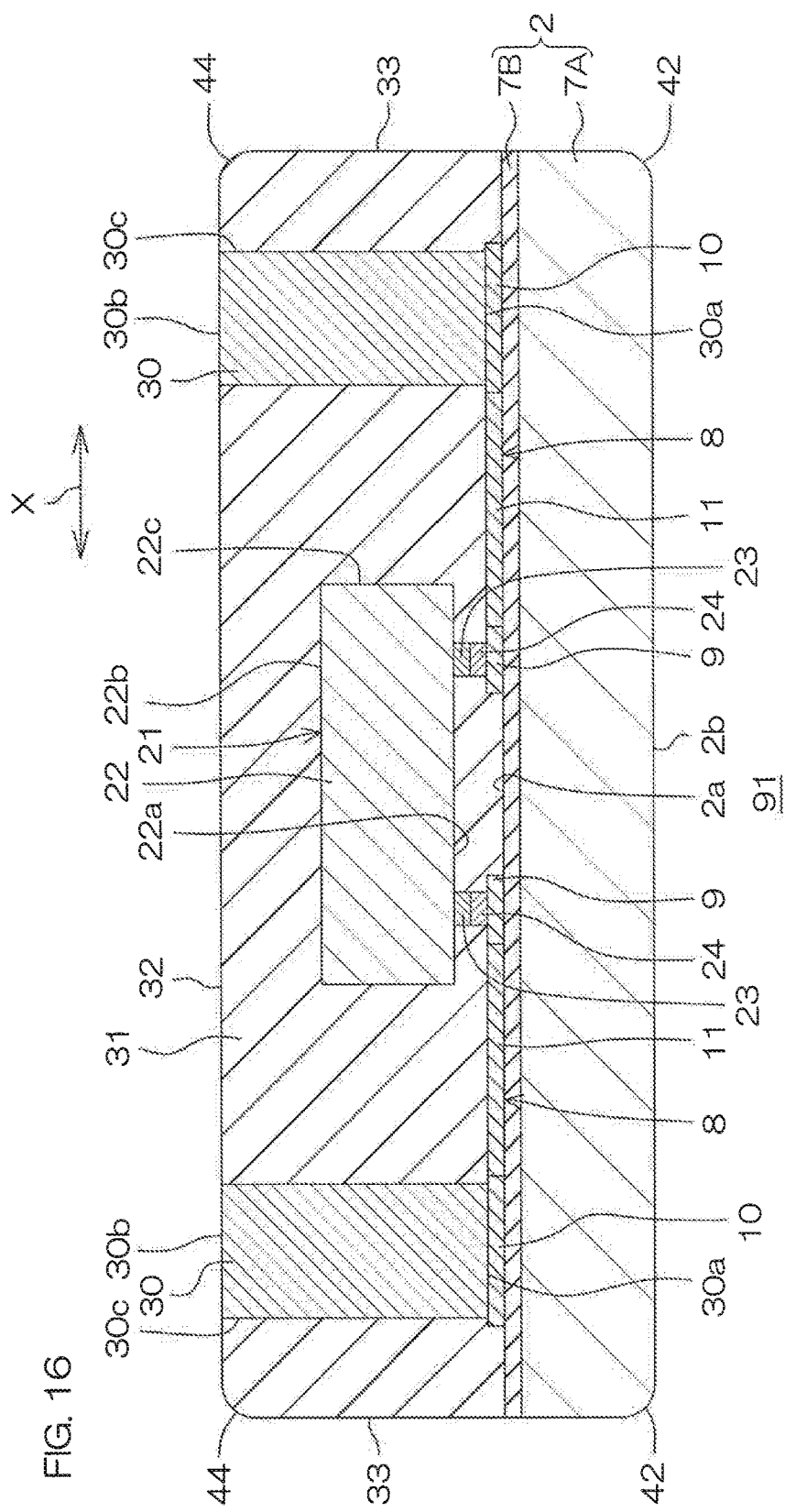
FIG. 16 is a cross sectional view of an electronic component according to a third preferred embodiment of the present invention.

FIG. 16 is a cross sectional view of an electronic component 91 according to a third preferred embodiment of the present invention.

In FIG. 16, the same reference sign is given to a constituent equivalent to each constituent of the first preferred embodiment described above, and descriptions thereof will be omitted.

Referring to FIG. 16, the electronic component 91 includes the interposer 2 in which the first principal surface 2a and the second principal surface 2b are each formed so as to have a flat surface parallel to each other.

As described above, likewise, the electronic component 91 makes it possible to fulfill the same effect as in the first preferred embodiment.

Although the preferred embodiments of the present invention have been described above, the present invention can be embodied in still other modes.

In each preferred embodiment described above, only any one among the first corner portion 41, the second corner portion 42, the first resin corner portion 43, the second resin corner portion 44, the top portion 45, and the resin top portion 46 may have the curved surface that is curved outwardly.

In each preferred embodiment described above, arbitrary two or more selected from among the first corner portion 41, the second corner portion 42, the first resin corner portion 43, the second resin corner portion 44, the top portion 45, and the resin top portion 46 may have the curved surface that is curved outwardly.

In each preferred embodiment described above, at least one of the first corner portion 41, the second corner portion 42, the first resin corner portion 43, the second resin corner portion 44, the top portion 45, or the resin top portion 46 may have the curved surface that is curved outwardly.

In each preferred embodiment described above, the interposer 2 may be formed in a polygonal shape, such as a triangular shape or a hexagonal shape, in plan view, instead of the quadrilateral shape. In this case, the corner portions connecting the side surfaces 2c extending along the directions intersecting each other may be formed so as to be curved toward the outside. Likewise, in this mode, it is possible to fulfill the same effect as in the aforementioned preferred embodiments.

The present application corresponds to Japanese Patent Application No. 2016-139701 filed at the Japan Patent Office on Jul. 14, 2016, and the entire disclosure of the application is incorporated herein by reference.

Although the preferred embodiments of the present invention have been described in detail, these preferred embodiments are merely concrete examples used to clarify the technical contents of the present invention, and the present invention should not be understood by being limited to these concrete examples, and the scope of the present invention is limited solely by the appended claims.

What is claimed is:

1. An electronic component comprising:
a substrate including a first principal surface, a second principal surface positioned on a side opposite to the first principal surface, a first side surface that connects the first principal surface and the second principal surface and that extends along a first direction, a second side surface that connects the first principal surface and the second principal surface and that extends along a second direction intersecting the first direction, and a corner portion that connects the first side surface and the second side surface and that has a curved surface curved outwardly; and
a chip arranged at the first principal surface of the substrate, wherein the substrate includes corner portion that connects the second principal surface and the first side surface and that has a curved surface curved outwardly, and a corner portion that connects the second principal surface and the second side surface and that has a curved surface curved outwardly.

2. The electronic component according to claim 1, further comprising a sealing resin that seals the chip on the first principal surface of the substrate and that includes a resin principal surface that faces the first principal surface of the substrate, a first resin side surface that extends from the resin principal surface toward the substrate along the first direction, a second resin side surface that extends from the resin principal surface toward the substrate along the second direction, and a corner portion that connects the first resin side surface and the second resin side surface and that has a curved surface curved outwardly.

3. An electronic component comprising: a substrate including a first principal surface, a second principal surface positioned on a side opposite to the first principal surface, a first side surface that connects the first principal surface and the second principal surface and that extends along a first direction, a second side surface that connects the first principal surface and the second principal surface and that extends along a second direction intersecting the first direction, and a corner portion that connects the first side surface and the second side surface and that has a curved surface curved outwardly; and a chip arranged at the first principal surface of the substrate, wherein the substrate includes corner portion that connects the second principal surface and the first side surface and that has a curved surface curved outwardly, and a corner portion that connects the second principal surface and the second side surface and that has a curved surface curved outwardly.

4. The electronic component according to claim 2, wherein
the first resin side surface is formed so as to be flush with respect to the first side surface of the substrate, and
the second resin side surface is formed so as to be flush with respect to the second side surface of the substrate.

5. The electronic component according to claim 1, further comprising a wiring formed at the first principal surface of the substrate,
wherein the chip includes a terminal electrode electrically connected to the wiring.

6. The electronic component according to claim 5, wherein the chip includes a mounting surface at which the terminal electrode is formed, and
the chip is arranged at the first principal surface of the substrate in a posture in which the mounting surface faces the first principal surface of the substrate.

7. The electronic component according to claim 5, further comprising an external terminal electrically connected to the wiring.

8. The electronic component according to claim 1, wherein a concave portion that is hollowed toward the second principal surface from the first principal surface is formed at the first principal surface of the substrate, and
the chip is accommodated in the concave portion.

9. The electronic component according to claim 8, further comprising a wiring formed at the concave portion of the substrate,
wherein the chip includes a terminal electrode electrically connected to the wiring.

10. The electronic component according to claim 9, wherein the chip includes a mounting surface at which the terminal electrode is formed, and
the chip is arranged at the first principal surface of the substrate in a posture in which the mounting surface faces the first principal surface of the substrate.

11. The electronic component according to claim 9, further comprising an external terminal formed in a region outside the concave portion in the first principal surface of the substrate, wherein the wiring is laid out from a region inside the concave portion to a region outside the concave portion in the first principal surface of the substrate so as to be electrically connected to the external terminal.

12. The electronic component according to claim 1, wherein the substrate is formed in a polygonal shape in plan view.

13. The electronic component according to claim 1, wherein the substrate is formed in a quadrilateral shape in plan view.

14. An electronic component comprising: a substrate including a first principal surface, a second principal surface positioned on a side opposite to the first a chip arranged at the first principal surface of the substrate; a sealing resin that seals the chip on the first principal surface of the substrate and that includes a resin principal surface that faces the first principal surface of the substrate, a resin side surface that extends from the resin principal surface toward the substrate, and a corner portion that connects the resin principal surface and the resin side surface and that has a curved surface curved outwardly.

15. An electronic component comprising:
a substrate including a principal surface;
a chip arranged at the principal surface of the substrate; and
a sealing resin that seals the chip on the principal surface of the substrate and that includes a resin principal surface that faces the principal surface of the substrate, a first resin side surface that extends from the resin principal surface toward the substrate along a first direction, a second resin side surface that extends from the resin principal surface toward the substrate along a second direction intersecting the first direction, and a corner portion that connects the first resin side surface and the second resin side surface and that has a curved surface curved outwardly.

16. An electronic component comprising:
a substrate including a principal surface;
a chip arranged at the principal surface of the substrate; and
a sealing resin that seals the chip on the principal surface of the substrate and that includes a resin principal surface that faces the principal surface of the substrate, a resin side surface that extends from the resin principal surface toward the substrate, and a corner portion that connects the resin principal surface and the resin side surface and that has a curved surface curved outwardly.

* * * * *